United States Patent
Cheng et al.

(10) Patent No.: US 11,955,527 B2
(45) Date of Patent: Apr. 9, 2024

(54) NANO TRANSISTORS WITH SOURCE/DRAIN HAVING SIDE CONTACTS TO 2-D MATERIAL

(71) Applicant: Taiwan Semiconductor Manufacturing Co., Ltd., Hsinchu (TW)

(72) Inventors: Chao-Ching Cheng, Hsinchu (TW); Yi-Tse Hung, Hsinchu (TW); Hung-Li Chiang, Taipei (TW); Tzu-Chiang Chen, Hsinchu (TW); Lain-Jong Li, Hsinchu (TW); Jin Cai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 212 days.

(21) Appl. No.: 17/351,622

(22) Filed: Jun. 18, 2021

(65) Prior Publication Data
US 2022/0140098 A1 May 5, 2022

Related U.S. Application Data

(60) Provisional application No. 63/107,041, filed on Oct. 29, 2020.

(51) Int. Cl.
*H01L 29/00* (2006.01)
*H01L 29/06* (2006.01)
(Continued)

(52) U.S. Cl.
CPC .... *H01L 29/42392* (2013.01); *H01L 29/0665* (2013.01); *H01L 29/2003* (2013.01);
(Continued)

(58) Field of Classification Search
CPC .......... H01L 29/0665; H01L 29/42392; H01L 29/66545; H01L 29/78696
See application file for complete search history.

(56) References Cited

U.S. PATENT DOCUMENTS 9,287,357 B2    3/2016   Rodder et al.
10,263,100 B1 *  4/2019   Bi ................... H01L 29/42364
(Continued)

FOREIGN PATENT DOCUMENTS

CN    108807270 A    11/2018
CN    109103084 A    12/2018
(Continued)

OTHER PUBLICATIONS

Lee, et al., "Highly Stable, Dual-Gated MoS2 Transistors Encapsulated by Hexagonal Boron Nitride with Gate-Controllable Contact, Resistance, and Threshold Voltage," ACS Nano, vol. 9, No. 7, Jun. 17, 2015, pp. 7019-7026.
(Continued)

*Primary Examiner* — Reema Patel
(74) *Attorney, Agent, or Firm* — Slater Matsil, LLP

(57) ABSTRACT

A method includes forming a first sacrificial layer over a substrate, and forming a sandwich structure over the first sacrificial layer. The sandwich structure includes a first isolation layer, a two-dimensional material over the first isolation layer, and a second isolation layer over the two-dimensional material. The method further includes forming a second sacrificial layer over the sandwich structure, forming a first source/drain region and a second source/drain region on opposing ends of, and contacting sidewalls of, the two-dimensional material, removing the first sacrificial layer and the second sacrificial layer to generate spaces, and forming a gate stack filling the spaces.

20 Claims, 21 Drawing Sheets

(51) Int. Cl.
*H01L 29/20* (2006.01)
*H01L 29/423* (2006.01)
*H01L 29/66* (2006.01)
*H01L 29/786* (2006.01)

(52) U.S. Cl.
CPC .. *H01L 29/66446* (2013.01); *H01L 29/66545* (2013.01); *H01L 29/78696* (2013.01)

(56) References Cited

U.S. PATENT DOCUMENTS

| | | | |
|---|---|---|---|
| 10,847,736 | B2 | 11/2020 | Lu |
| 10,964,798 | B2 | 3/2021 | Cheng |
| 11,018,242 | B2 | 5/2021 | Li |
| 11,037,783 | B2 | 6/2021 | Li et al. |
| 11,097,783 | B2 | 8/2021 | Ikeda et al. |
| 11,121,258 | B2 | 9/2021 | Kula et al. |
| 2007/0132009 | A1 | 6/2007 | Takeuchi |
| 2015/0137075 | A1 | 5/2015 | Heo et al. |
| 2015/0364542 | A1 | 12/2015 | Rodder |
| 2018/0301341 | A1 | 10/2018 | Coquand et al. |
| 2019/0341469 | A1* | 11/2019 | Cheng ............... H01L 29/66742 |
| 2020/0044043 | A1 | 2/2020 | Hsu et al. |
| 2020/0235098 | A1* | 7/2020 | Li ........................ H01L 27/092 |
| 2020/0287055 | A1 | 9/2020 | Lee et al. |

FOREIGN PATENT DOCUMENTS

| | | |
|---|---|---|
| CN | 109786250 A | 5/2019 |
| KR | 20160019051 A | 2/2016 |
| KR | 20180138099 A | 12/2018 |
| TW | 202013738 A | 4/2020 |
| TW | 202016985 A | 5/2020 |

OTHER PUBLICATIONS

Nazir, G., et al., "Energy-Efficient Tunneling Field-Effect Transistors for Low-Power Device Applications: Challenges and Opportunities," Applied Materials & Interfaces, 12, Sep. 11, 2020, pp. 47127-47163.

Prakash, A., et al., "Understanding contact gating in Schottky barrier transistors from 2D channels," Scientific Reports 7:12596, Oct. 3, 2017, 9 pages.

Kim, et al., "Fermi Level Pinning at Electrical Metal Contacts of Monolayer Molybdenum Dichalcogenies," ACS Nano, vol. 11, Jan. 15, 2017, pp. 1588-1596.

* cited by examiner

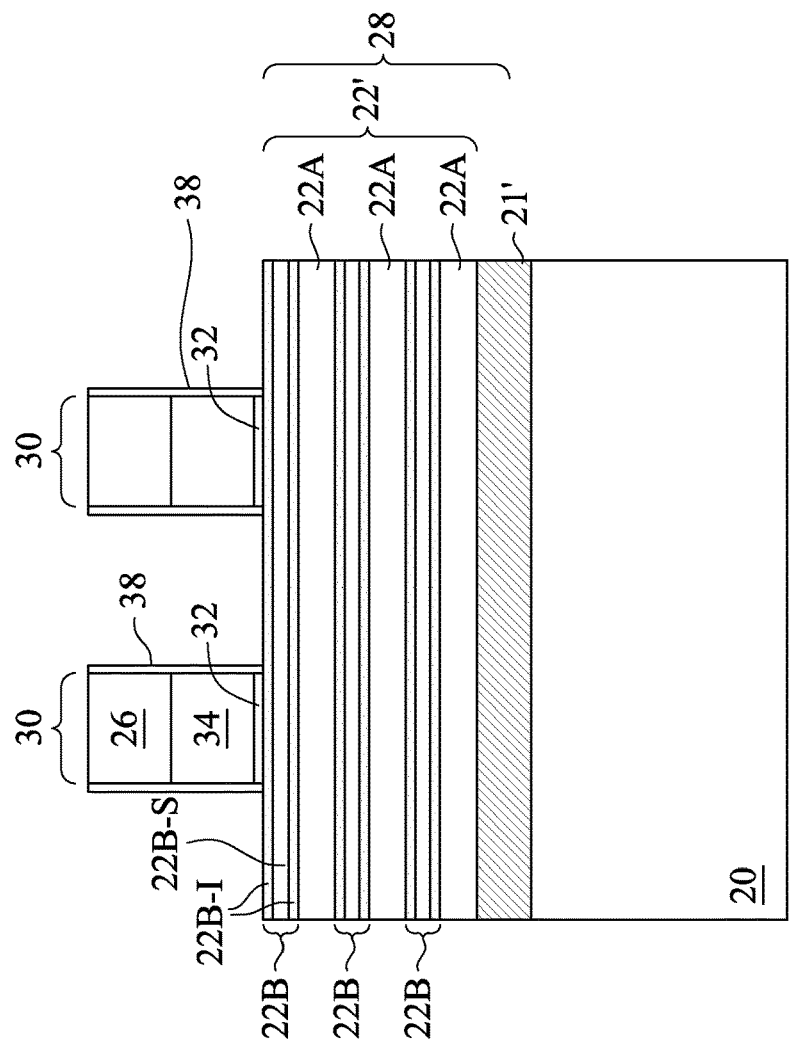
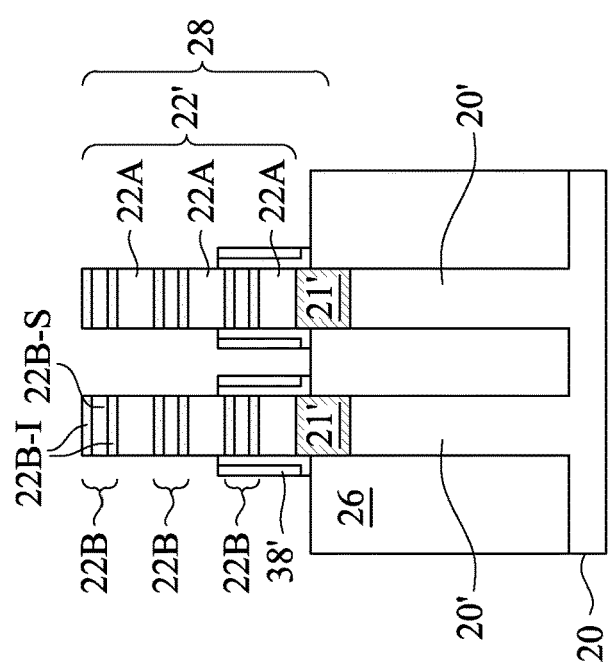
Fig. 5B
Fig. 5A

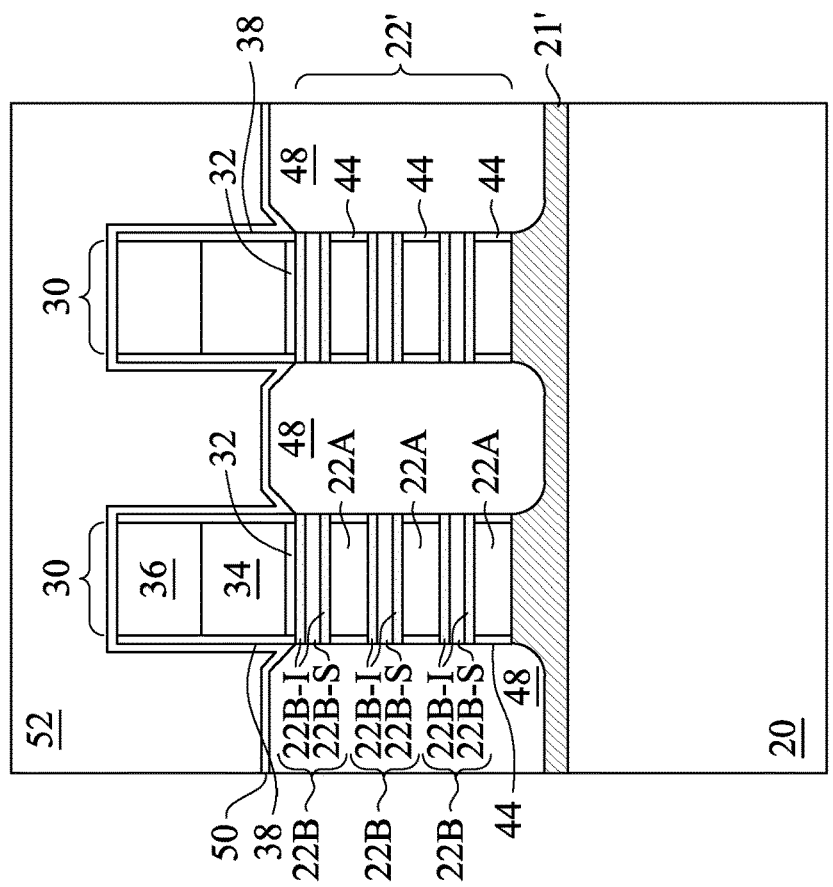
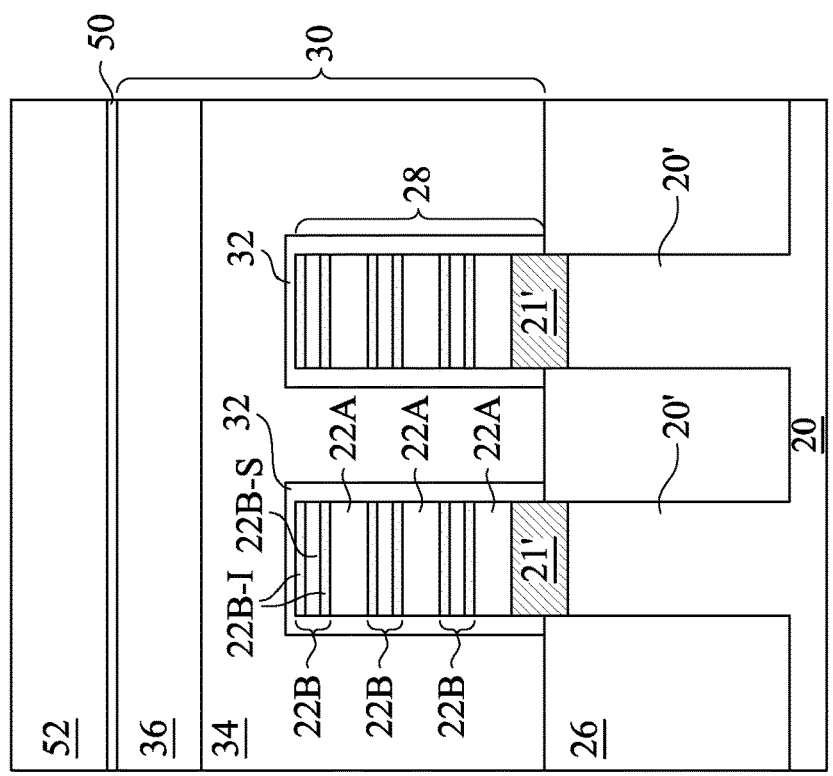
Fig. 9B
Fig. 9A

NANO TRANSISTORS WITH SOURCE/DRAIN HAVING SIDE CONTACTS TO 2-D MATERIAL

PRIORITY CLAIM AND CROSS-REFERENCE

This application claims the benefit of the U.S. Provisional Application No. 63/107,041, filed on Oct. 29, 2020, and entitled "Devices with Stacked Sheet Channels Using Two-Dimensional Material and with Source/Drain Side Contact Using Metal Material," which application is hereby incorporated herein by reference.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography processes to form circuit components and elements thereon.

The semiconductor industry continues to improve the integration density of various electronic components (for example, transistors, diodes, resistors, capacitors, etc.) through continual reduction in minimum feature size, which allows more components to be integrated into a given area. As the minimum feature sizes are reduced, however, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1-4, 5A, 5B, 6A, 6B, 7A, 7B, 8A, 8B, 9A, 9B, 9C, 10A, 10B, 11A, 11B, 12A, 12B, 13A, 13B, 14A, 14B, 14C, 15A, 15B, 15C, 16A, 16B, and 16C illustrate the perspective views and cross-sectional views of intermediate stages in the formation of nanostructure transistors in accordance with some embodiments.

DETAILED DESCRIPTION

Figure 1:
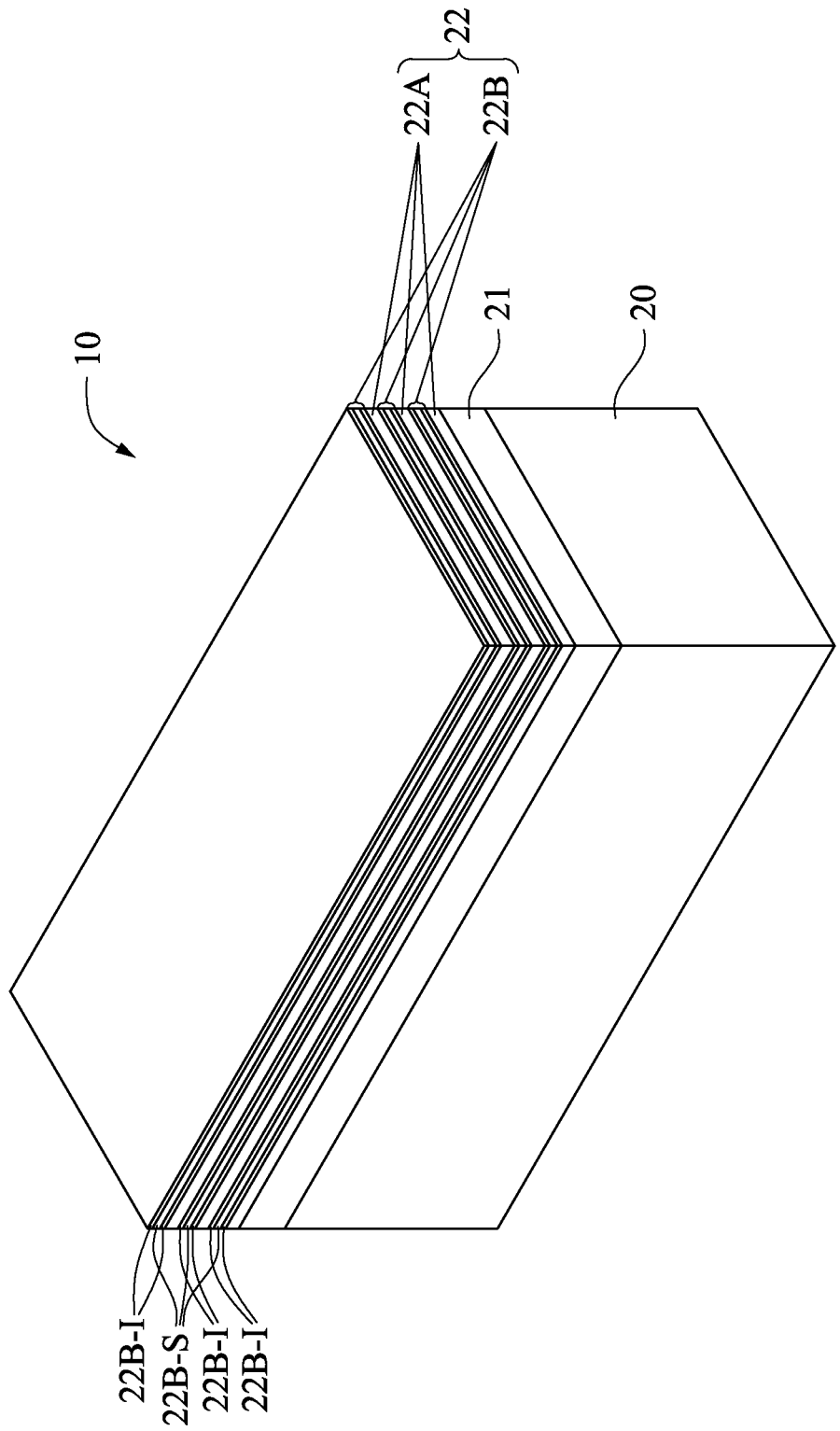

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A nanostructure transistor (also referred to as a nano-FET (Field-Effect Transistor)), which is also a Gate-All-Around (GAA) transistor, and the method of forming the same are provided in accordance with some embodiments. In accordance with some embodiments of the present disclosure, a two-dimensional (2D) material is used to form channels of the nano-FET. Metal contacts are formed to form side contact with the channels. This may avoid the pinning of the fermi level of the metal contact to the upper half of the 2D material, so that both p-type and n-type nano-FETs may have improved performance. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-4, 5A, 5B, 6A, 6B, 7A, 7B, 8A, 8B, 9A, 9B, 9C, 10A, 10B, 11A, 11B, 12A, 12B, 13A, 13B, 14A, 14B, 14C, 15A, 15B, 15C, 16A, 16B, and 16C illustrate the perspective views and cross-sectional views of intermediate stages in the formation of a nanostructure transistor in accordance with some embodiments of the present disclosure. The corresponding processes are also reflected schematically in the process flow shown in FIG. 17.

Referring to FIG. 1, a perspective view of wafer 10 is shown. Wafer 10 includes substrate 20, isolation layer 21 on substrate 20, and multilayer stack 22 over isolation layer 21. In accordance with some embodiments, substrate 20 is a semiconductor substrate, which may be a silicon substrate, a silicon germanium (SiGe) substrate, or the like, while other substrates and/or structures, such as semiconductor-on-insulator (SOI), strained SOI, silicon germanium on insulator, or the like, could be used. Substrate 20 may be doped as a p-type semiconductor, although in other embodiments, it may be doped as an n-type semiconductor. Isolation layer 21 is deposited on substrate 20. In accordance with some embodiments, isolation layer 21 is formed of a dielectric material such as silicon nitride, silicon oxide, silicon oxynitride, silicon oxy carbo-nitride, or the like. Isolation layer 21 may electrically isolate the subsequently formed nano-FET from substrate 20.

In accordance with some embodiments, multilayer stack 22 is formed through a series of formation processes (including, for example, deposition and transferring), so that different materials are formed alternatively. The respective process is illustrated as process 202 in the process flow 200 shown in FIG. 17. In accordance with some embodiments, multilayer stack 22 comprises layers 22A formed of a first material and sandwich structures 22B formed of materials different from the first material. In accordance with some embodiments, the first material of a layer 22A may be formed of or comprise a semiconductor material, a dielectric material, or the like. The available semiconductor material may include Si, SiGe, Ge, GaAs, InSb, GaSb, InAlAs, InGaAs, GaSbP, GaAsSb, or the like. When formed of a semiconductor material, the layer 22A may have an amorphous or a polycrystalline structure. For example, layer 22A may be formed of amorphous silicon. The available dielectric material is different from the material of isolation layer 21, and may be formed of or comprise silicon oxide, silicon nitride, silicon oxycarbide, or the like. In accordance with some embodiments, the deposition of layers 22A (for example, amorphous silicon) may include Chemical Vapor deposition (CVD), Low Pressure CVD (LPCVD), Atomic Layer Deposition (ALD), Ultra High Vacuum CVD (UHVCVD), Reduced Pressure CVD (RPCVD), or the like. In accordance with some embodiments, the layer 22A is formed to a first thickness in the range between about 30Å and about 300Å. However, any suitable thickness may be utilized while remaining within the scope of the embodiments.

Once the layer 22A has been deposited over substrate 20, a sandwich structure 22B is formed over layer 22A. Sandwich structure 22B includes two isolation layers 22B-I and semiconductor layer 22B-S sandwiched between isolation layers 22B-I.

In accordance with some embodiments of the present disclosure, semiconductor layer 22B-S is formed of a 2D material, which is also referred to as a Van Der Waals material. The 2D material includes one or a plurality (such as two, three, four, five, or more) of monolayers. Strong bonds such as covalence bonds are formed within the monolayers to bond the atoms in the same monolayer to each other. The bonding force between neighboring monolayers is Van Der Waals force, which is a weak force. Accordingly, although semiconductor layer 22B-S may include more than one monolayer, semiconductor layer 22B-S is referred to as a 2D layer. The thicknesses of semiconductor layer 22B-S may be smaller than about 5 nm, and may be in the range between about 0.5 nm and about 5 nm, or in the range between about 0.7 nm and about 3 nm.

In accordance with some embodiments of the present disclosure, semiconductor layer 22B-S is formed of or comprises a Transition Metal Dichalcogenide (TMD) material, which comprises the compound of a transition metal and a group-VIA element. The transition metal may include W, Mo, Ti, V, Co, Ni, Zr, Tc, Rh, Pd, Hf, Ta, Re, Ir, Pt, or the like. The group-VIA element may be sulfur (S), selenium (Se), tellurium (Te), or the like. For example, semiconductor layer 22B-S may be formed of or comprise $MoS_2$, $MoSe_2$, $WS_2$, $WSe_2$, or the like. In accordance with some embodiments, a mono layer of the 2D material includes transition metal atoms forming a layer in middle, and the group-VIA atoms forming a first layer underlying the layer of transition metal atoms, and a second layer over the layer of transition metal atoms. Each of the transition metal atoms is bonded to four group-VIA atoms, and each of the group-VIA atoms is bonded to two transition metal atoms. The combination of one layer of transition metal atoms and two layers of the group-VIA atoms is referred to as a monolayer of the TMD material. The bonds (within monolayers) between the transition metal atoms and the group-VIA atoms are covalence bonds, and the bonds between the monolayers are through Van Der Waals force.

Isolation layers 22B-I are formed over and under the corresponding semiconductor layer 22B-S. In accordance with some embodiments, isolation layers 22B-I are formed of hexagonal Boron Nitride (hBN). The formation of isolation layers 22B-I may include depositing the hBN film (for example, on a copper layer) on another wafer, and then transferring the hBN film onto wafer 10 through wafer-level transferring process. In accordance with other embodiments, isolation layers 22B-I may be formed of other materials such as silicon oxide, silicon oxy-fluoride (SiOF), silicon oxycarbide (SiOC), or the like. In accordance with some embodiments, a sandwiched structure 22B is formed on another wafer, and then transferring to wafer 10. In accordance with alternative embodiments, the hBN films are transferred to wafer 10, and semiconductor layer 22B-S is directly deposited on wafer 10.

Once the sandwich structure 22B has been formed over the layer 22A, the formation processes of layer 22A and sandwich structure 22B is repeated to form the remaining layers in multilayer stack 22, until a desired topmost layer of multilayer stack 22 has been formed. In accordance with alternative embodiments, the entire layer stack is formed on another wafer, and is transferred to wafer 10 as an entirety. In accordance with some embodiments, layers 22A have thicknesses the same as or similar to each other, and sandwich structures 22B have thicknesses the same as or similar to each other. Layers 22A may also have the same thicknesses as, or different thicknesses from, that of sandwich structures 22B in accordance with alternative embodiments. In accordance with some embodiments, layers 22A are removed in the subsequent processes, and are alternatively referred to as sacrificial layers 22A throughout the description.

In accordance with some embodiments, there are some pad oxide layer(s) and hard mask layer(s) (not shown) formed over multilayer stack 22, which layers are used for the patterning process as presented in subsequent figures. These layers are patterned, and may be used as etching masks.

Figure 2:
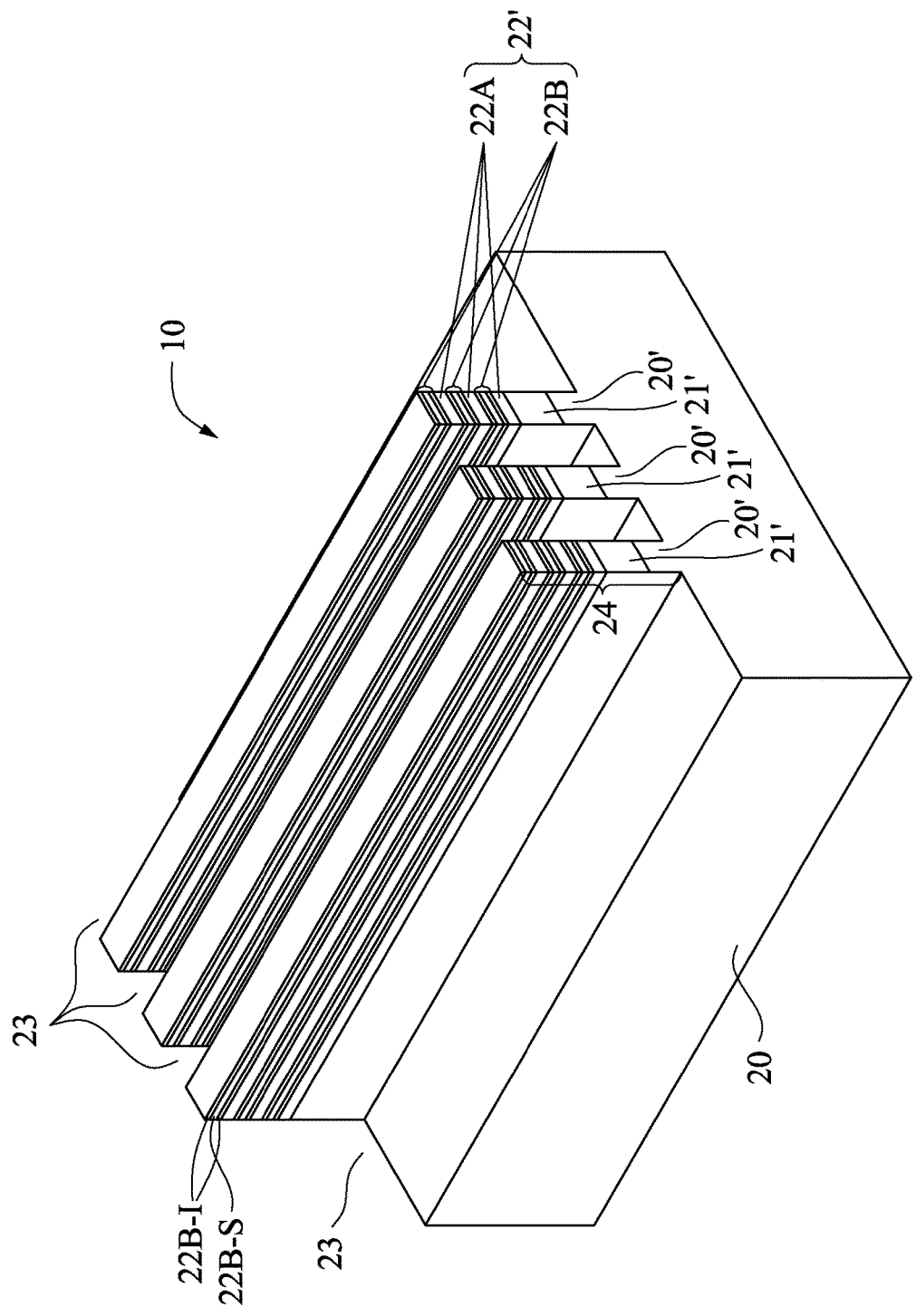

Referring to FIG. 2, multilayer stack 22, isolation layer 21 and a portion of the underlying substrate 20 are patterned in an etching process(es), so that trenches 23 are formed. The respective process is illustrated as process 204 in the process flow 200 shown in FIG. 17. The patterning process may include a plurality of etching processes, wherein different etching gases are used to etch the different materials of multilayer stack 22, isolation layer 21, and substrate 20. Trenches 23 extend into substrate 20. The remaining portions of multilayer stacks 22 and isolation layer 21 are referred to as multilayer stacks 22' and isolation layer 21', respectively. Underlying multilayer stacks 22' and the patterned isolation layer 21', some strip top portions of substrate 20 are left, and are referred to as substrate strips 20' hereinafter. Multilayer stacks 22' include semiconductor layers 22A and sandwich structures 22B. Semiconductor layers 22A are alternatively referred to as sacrificial layers, and sandwich structures 22B are alternatively referred to as nanostructures hereinafter. The portions of multilayer stacks 22', the underlying insolation layer 21', and substrate strips 20' are collectively referred to as strips 24.

In above-illustrated embodiments, the Gate-All-Around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 3:
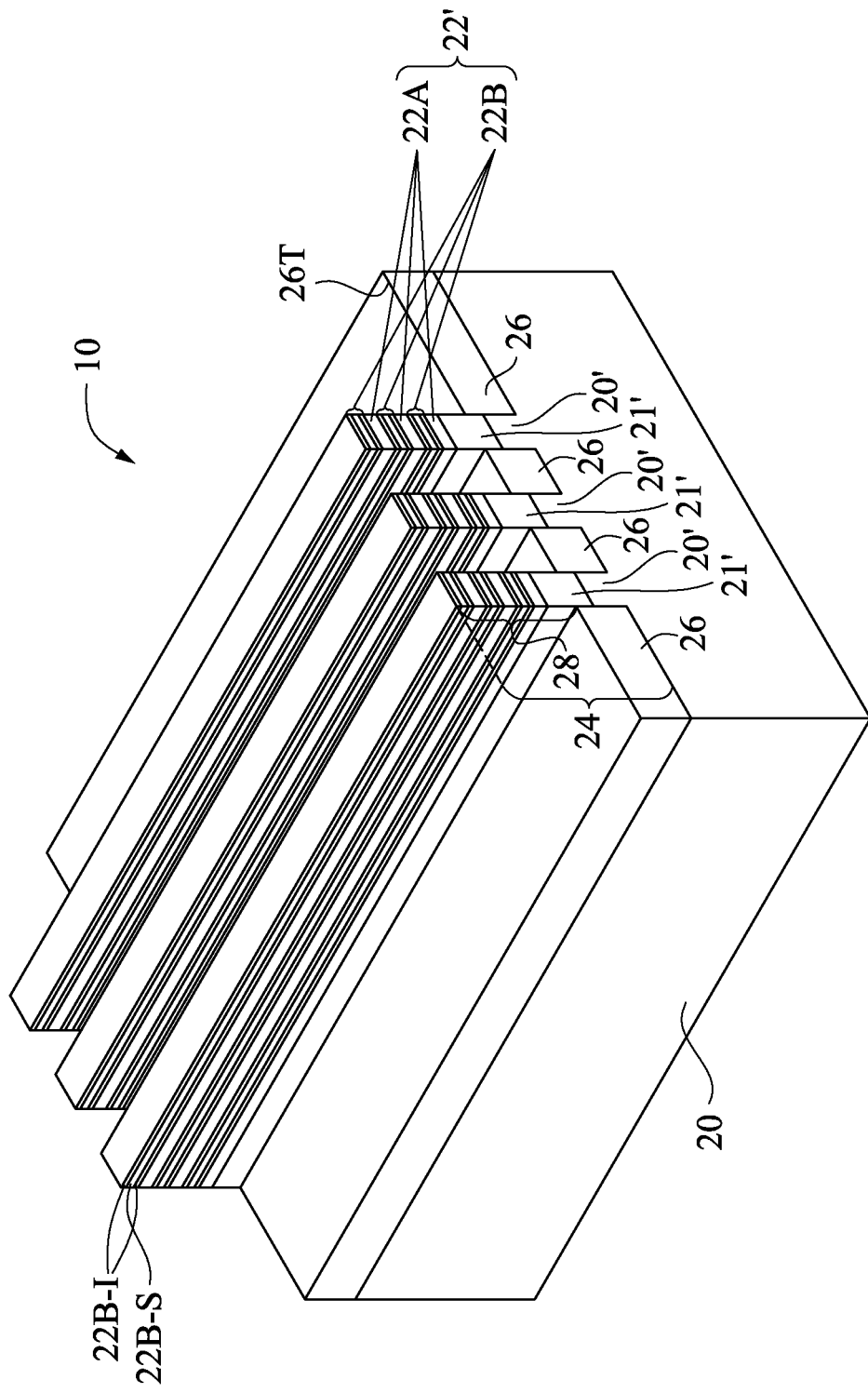

FIG. 3 illustrates the formation of isolation regions 26, which are also referred to as Shallow Trench Isolation (STI) regions throughout the description. The respective process is illustrated as process 206 in the process flow 200 shown in FIG. 17. STI regions 26 may include a liner oxide (not shown), which may be a thermal oxide formed through the thermal oxidation of a surface layer of substrate 20. The liner oxide may also be a deposited silicon oxide layer formed using, for example, ALD, High-Density Plasma Chemical Vapor Deposition (HDPCVD), CVD, or the like. STI regions 26 may also include a dielectric material over the liner oxide, wherein the dielectric material may be formed using Flowable Chemical Vapor Deposition (FCVD), spin-on coating, HDPCVD, or the like. A planarization process such as a Chemical Mechanical Polish (CMP) process or a mechanical grinding process may then be performed to level the top surface of the dielectric material, and the remaining portions of the dielectric materials are STI regions 26.

STI regions 26 are then recessed, so that the top portions of strips 24 protrude higher than the top surfaces 26T of the remaining portions of STI regions 26 to form protruding fins 28. Protruding fins 28 include multilayer stacks 22', and may or may not include a top portion of isolation layer 21'. The recessing of STI regions 26 may be performed through a dry etching process, wherein $NF_3$ and $NH_3$, for example, are used as the etching gases. During the etching process, plasma may be generated. Argon may also be included. In accordance with alternative embodiments of the present disclosure, the recessing of STI regions 26 is performed through a wet etching process. The etching chemical may include diluted HF, for example.

Figure 4:
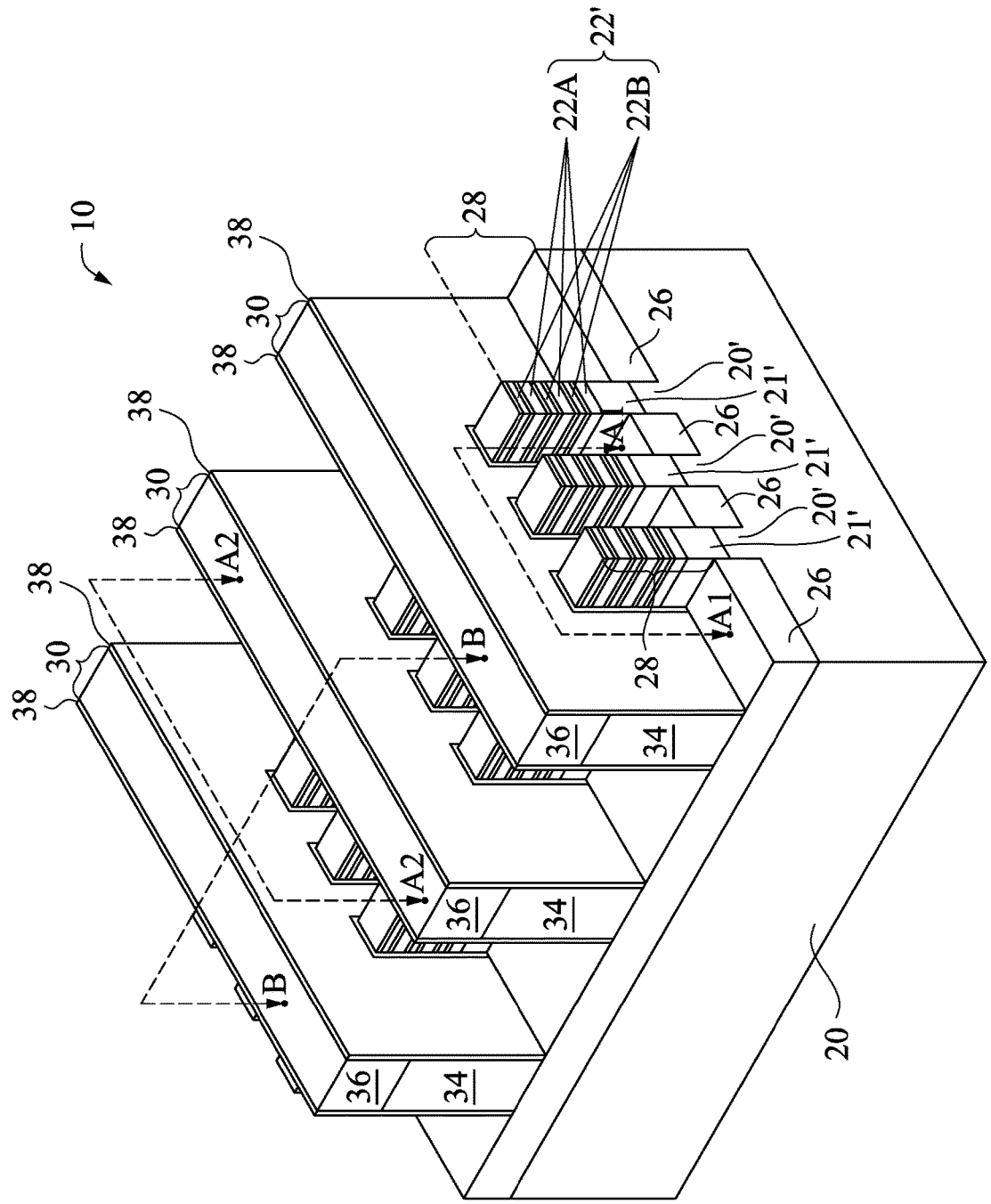

Referring to FIG. 4, dummy gate stacks 30 and gate spacers 38 are formed on the top surfaces and the sidewalls of (protruding) fins 28. The respective process is illustrated as process 208 in the process flow 200 shown in FIG. 17. The formation process of dummy gate stacks 30 may include depositing a dummy gate dielectric layer, a dummy gate electrode layer, one or more hard mask layers, and then performing a plurality of etching processes to pattern the deposited layers. Dummy gate stacks 30 may include dummy gate dielectrics 32 and dummy gate electrodes 34 over dummy gate dielectrics 32. Dummy gate dielectrics 32 may be formed by depositing a dielectric layer (such as a silicon oxide layer) using a conformal deposition method such as ALD or CVD. Dummy gate electrodes 34 may be formed, for example, using polysilicon or amorphous silicon, and other materials such as amorphous carbon may also be used. Each of dummy gate stacks 30 may also include one (or a plurality of) hard mask layer 36 over dummy gate electrode 34. Hard mask layers 36 may be formed of silicon nitride, silicon oxide, silicon carbo-nitride, silicon oxy-carbo nitride, or multilayers thereof. Dummy gate stacks 30 may cross over a single one or a plurality of protruding fins 28 and the STI regions 26 between protruding fins 28. Dummy gate stacks 30 also have lengthwise directions perpendicular to the lengthwise directions of protruding fins 28. The formation of dummy gate stacks 30 includes forming a dummy gate dielectric layer, depositing a dummy gate electrode layer over the dummy gate dielectric layer, depositing one or more hard mask layers, and then patterning the formed layers through a patterning process(es).

Next, gate spacers 38 are formed on the sidewalls of dummy gate stacks 30. In accordance with some embodiments of the present disclosure, gate spacers 38 are formed of a dielectric material such as silicon nitride (SiN), silicon oxide ($SiO_2$), silicon carbo-nitride (SiCN), silicon oxynitride (SiON), silicon oxy-carbo-nitride (SiOCN), or the like, and may have a single-layer structure or a multilayer structure including a plurality of dielectric layers. The formation process of gate spacers 38 may include depositing one or a plurality of dielectric layers, and then performing an anisotropic etching process(es) on the dielectric layer(s). The remaining portions of the dielectric layer(s) are gate spacers 38.

FIGS. 5A and 5B illustrate the cross-sectional views of the structure shown in FIG. 4. FIG. 5A illustrates the reference cross-section A1-A1 in FIG. 4, which cross-section cuts through the portions of protruding fins 28 not covered by dummy gate stacks 30 and gate spacers 38, and is parallel to the gate-length direction. Fin spacers 38', which are on the sidewalls of protruding fins 28, are also illustrated in FIG. 5A. FIG. 5B illustrates the reference cross-section B-B in FIG. 4, which reference cross-section is parallel to the lengthwise directions of protruding fins 28.

Figure 6B:
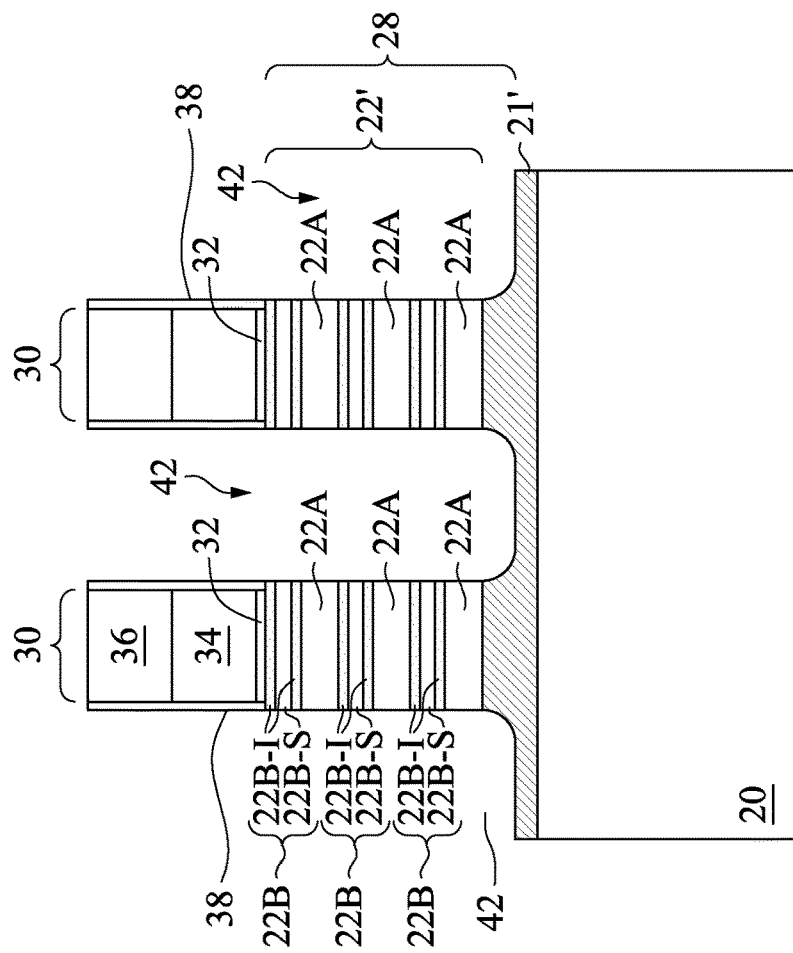
Figure 6A:
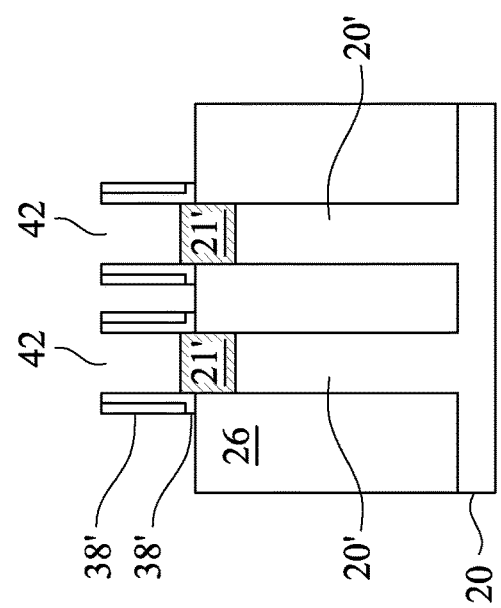

Referring to FIGS. 6A and 6B, the portions of protruding fins 28 that are not directly underlying dummy gate stacks 30 and gate spacers 38 are recessed through an etching process to form recesses 42. The respective process is illustrated as process 210 in the process flow 200 shown in FIG. 17. The etching gases are selected according to the materials of multiplayer stack 22. The bottoms of recesses 42 are at least level with, or may be lower than (as shown in FIG. 6B), the bottoms of multilayer stacks 22'. The etching may be anisotropic, so that the sidewalls of multilayer stacks 22' facing recesses 42 are vertical and straight, as shown in FIG. 6B. In accordance with some embodiments, as shown in FIG. 6B, a portion of isolation layer 21' is directly underlying recesses 42.

Figure 7B:
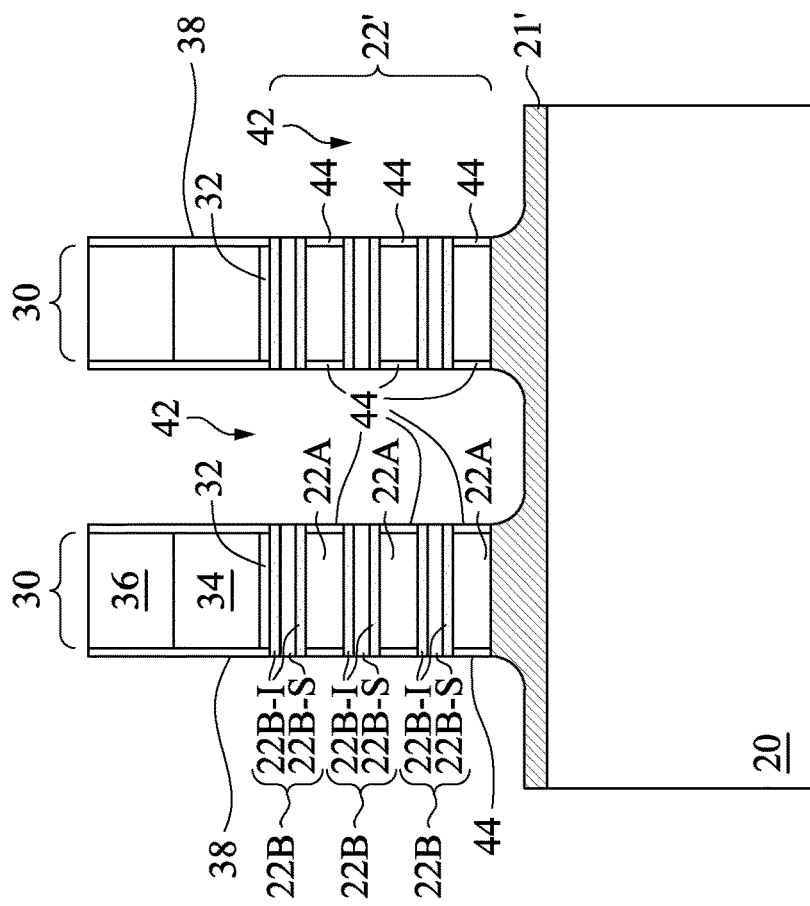
Figure 7A:
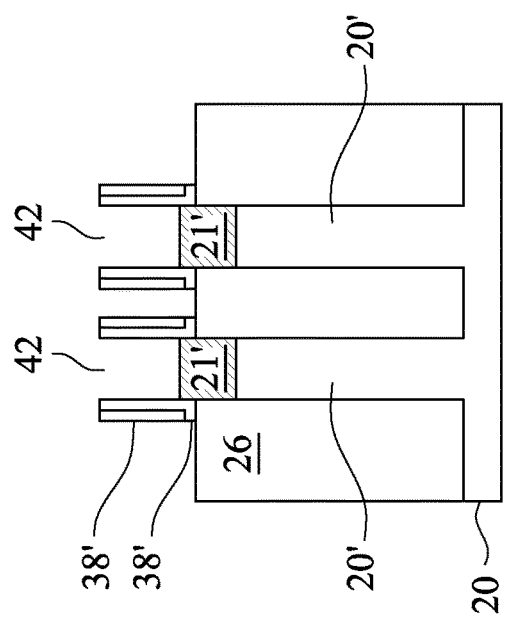

FIGS. 7A and 7B illustrate the formation of inner spacers 44 (FIG. 7B). The respective process is illustrated as process 212 in the process flow 200 shown in FIG. 17. In accordance with some embodiments, the formation of inner spacers 44 may include laterally recessing sacrificial semiconductor layers 22A, and filling a dielectric material into the corresponding recesses to form inner spacers 44. The lateral recessing of sacrificial semiconductor layers 22A may be achieved through a wet etching process using an etchant that is more selective to the material of sacrificial semiconductor layers 22A (for example, amorphous silicon) than the materials of the sandwich structures 22B (for example, hBN and the 2D material). For example, the wet etching process may be performed using tetra methyl ammonium hydroxide (TMAH). In accordance with alternative embodiments, the lateral recessing of sacrificial semiconductor layers 22A is performed through an isotropic dry etching process or a combination of a dry etching process and a wet etching process.

Once sacrificial semiconductor layers 22A are recessed laterally to form the corresponding recesses, a spacer material is deposited to fill the corresponding recesses. The spacer material may be a dielectric material different from the material of gate spacers 38, and may be a silicon-comprising material such as silicon nitride (SiN), silicon oxide ($SiO_2$), silicon oxynitride (SiON), silicon oxycarbo-nitride (SiOCN), silicon carbo-nitride (SiCN), silicon oxy-carbide (SiOC), AlOx, HfOx, HfON, MoOx, WOx, or the like, while any other suitable material such as low-k materials with a k-value less than about 3.5, or combinations of the aforementioned materials may also be utilized. The spacer material (such as nitrogen) may also have the function of doping the 2D material. The spacer material may be deposited using a conformal deposition process such as CVD, ALD, or the like, to a thickness in the range between about 2 nm and about 10 nm, for example. A dry etching and/or a wet etching process is then performed to remove the portions of the spacer material on the sidewalls of sandwich structures 22B, so that the sidewalls of sandwich structures 22B are exposed. The remaining portions of the spacer material are inner spacers 44. Inner spacers 44 are used to isolate the subsequently formed replacement gate electrodes from the subsequently formed source/drain regions, and to prevent the damage of the source/drain regions in subsequent etching processes, such as the etching of dummy gate stacks 30.

Figure 8B:
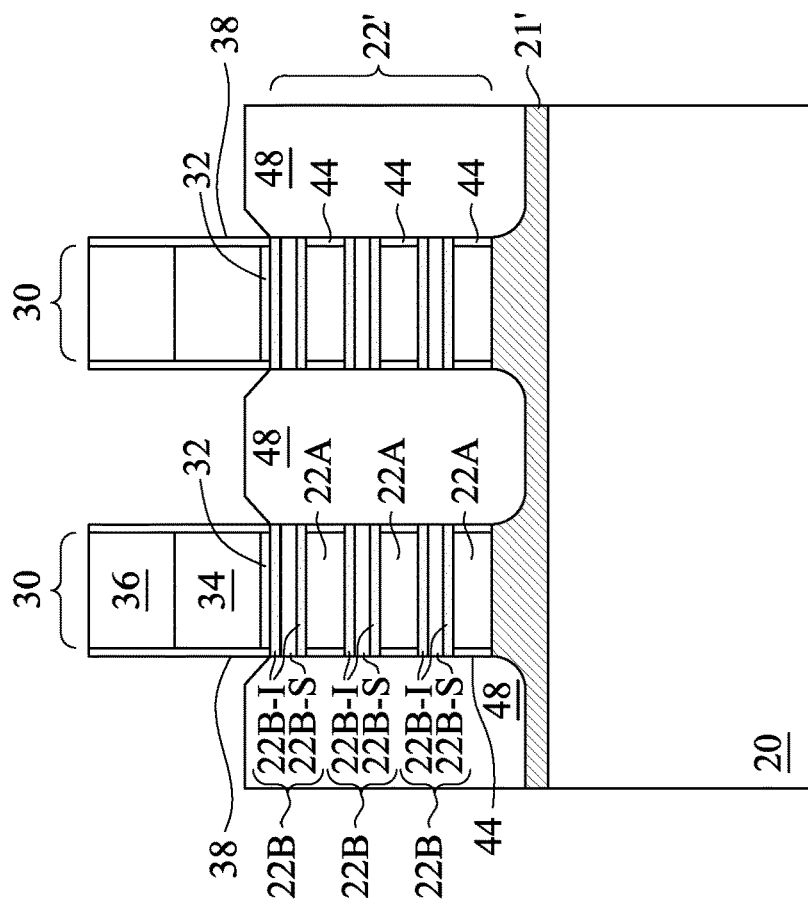
Figure 8A:
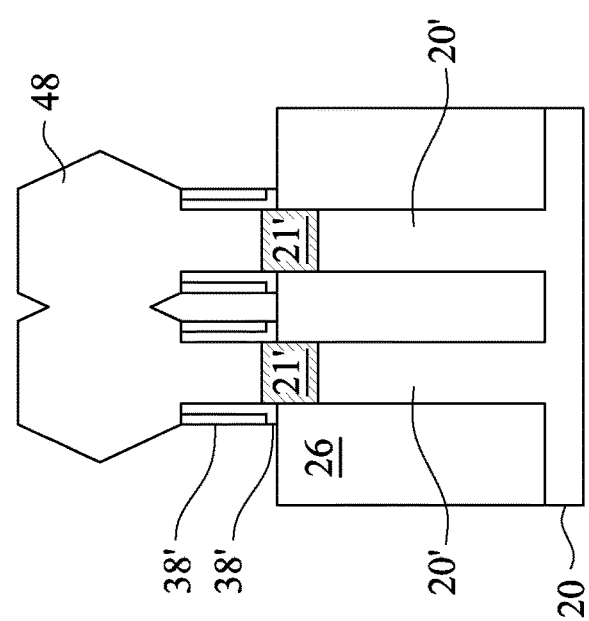

Referring to FIGS. 8A and 8B, dummy source/drain regions 48 are formed in recesses 42. The respective process is illustrated as process 214 in the process flow 200 shown in FIG. 17. In accordance with some embodiments, dummy source/drain regions 48 are formed of or comprise a semiconductor material such as silicon, germanium, silicon germanium, and the semiconductor material may be deposited as amorphous regions or polycrystalline regions. In accordance with some embodiments, the deposition is performed through a low-temperature deposition process, and the deposition temperature is lower than the required temperature (for example, about 500° C.) for epitaxy to occur. For example, the deposition may be performed at room temperature. With dummy source/drain regions 48 being deposited at a low temperature, the thermal budget may be lowered. The bottoms of dummy source/drain regions 48 may be in contact with the top surfaces of isolation layer 21' in the illustrated cross-section. As shown in FIG. 8B, the sidewalls of dummy source/drain regions 48 are in contact with the sidewalls of sandwich structures 22B and inner spacers 44. By forming dummy source/drain regions 48 and later-on replacing the dummy source/drain regions 48 with metal source/drain regions at a time after replacement gate stacks are formed, the metal source/drain regions may avoid the thermal budget in the formation of replacement gate stacks.

The subsequent figure numbers in FIGS. 9A, 9B, and 9C through FIGS. 16A, 16B, and 16C may have numbers followed by letters A, B, or C, wherein the figure with the figure number having the letter A indicates that the corresponding figure shows a reference cross-section same as the reference cross-section A2-A2 in FIG. 4, the figure with the figure number having the letter B indicates that the corresponding figure shows a reference cross-section same as the reference cross-section B-B in FIG. 4, and the figure with the figure number having the letter C indicates that the corresponding figure shows a reference cross-section same as the reference cross-section A-A1 in FIG. 4.

Figure 9C:
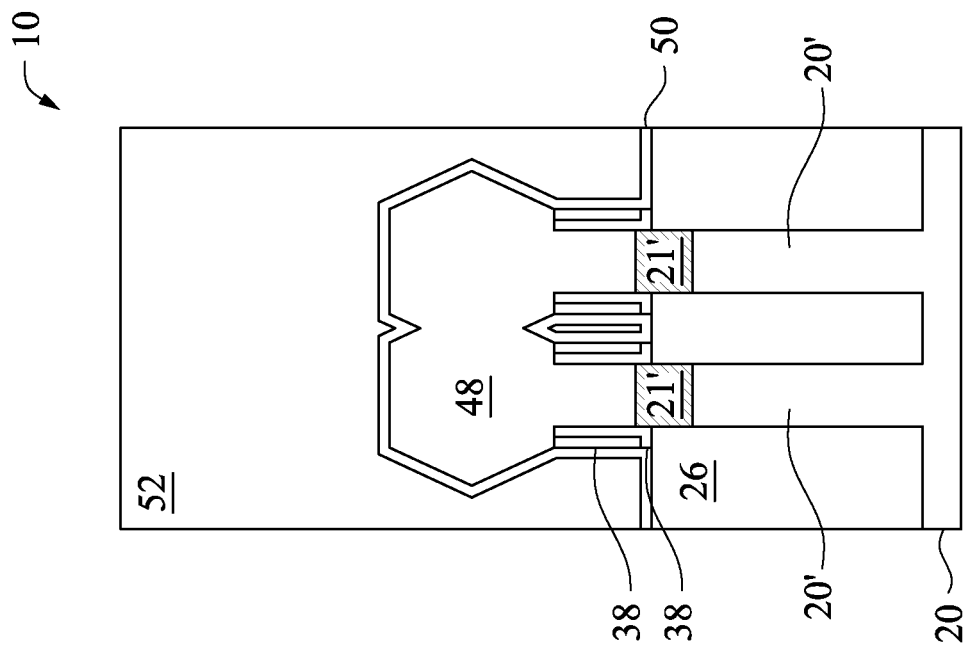

FIGS. 9A, 9B, and 9C illustrate the cross-sectional views of the structure after the formation of Contact Etch Stop Layer (CESL) 50 and Inter-Layer Dielectric (ILD) 52. The respective process is illustrated as process 216 in the process flow 200 shown in FIG. 17. CESL 50 may be formed of silicon oxide, silicon nitride, silicon carbo-nitride, or the like, and may be formed using CVD, ALD, or the like. ILD 52 may include a dielectric material formed using, for example, FCVD, spin-on coating, CVD, or any other suitable deposition method. ILD 52 may be formed of an oxygen-containing dielectric material, which may be a silicon-oxide based material formed using Tetra Ethyl Ortho Silicate (TEOS) as a precursor, Phospho-Silicate Glass (PSG), Boro-Silicate Glass (BSG), Boron-Doped Phospho-Silicate Glass (BPSG), Undoped Silicate Glass (USG), or the like.

Figure 10B:
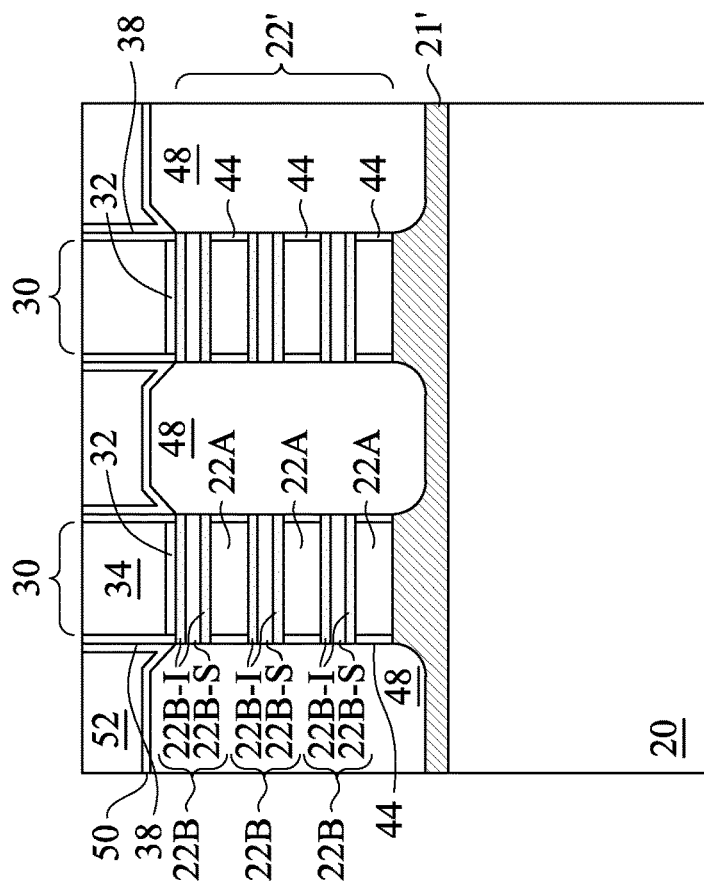
Figure 10A:
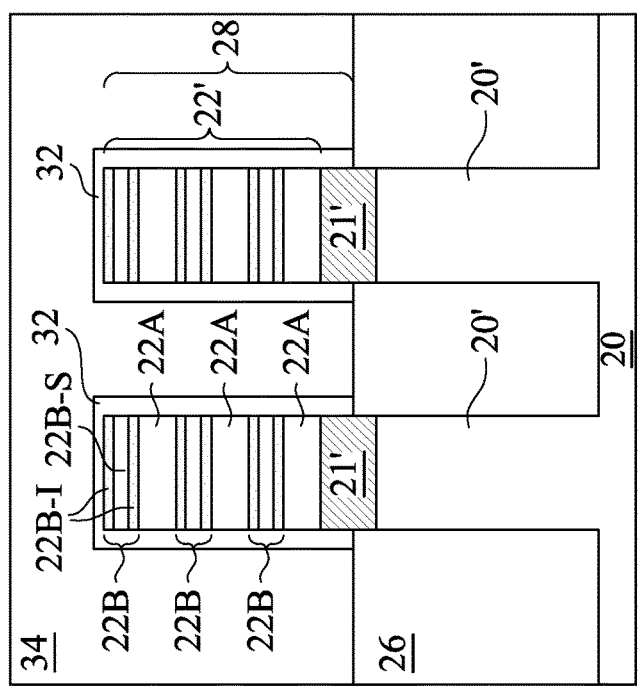

FIGS. 10A and 10B through FIGS. 13A and 13B illustrate the process for forming replacement gate stacks. In FIGS. 10A and 10B, a planarization process such as a CMP process or a mechanical grinding process is performed to level the top surface of ILD 52, and to reveal dummy gate stacks 30. The respective process is illustrated as process 218 in the process flow 200 shown in FIG. 17. In accordance with some embodiments, hard masks 36 are removed by the planarization process to reveal dummy gate electrodes 34. In accordance with alternative embodiments, the planarization process may reveal, and is stopped on, hard masks 36. In accordance with some embodiments, after the planarization process, the top surfaces of dummy gate electrodes 34 (or masks 36), gate spacers 38, and ILD 52 are level within process variations.

Figure 11B:
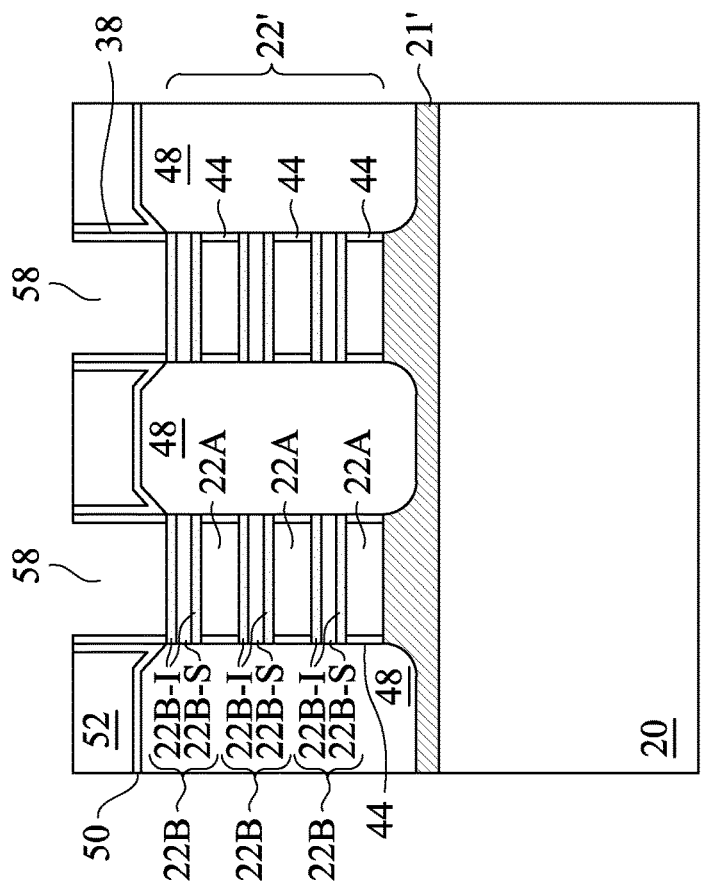
Figure 11A:
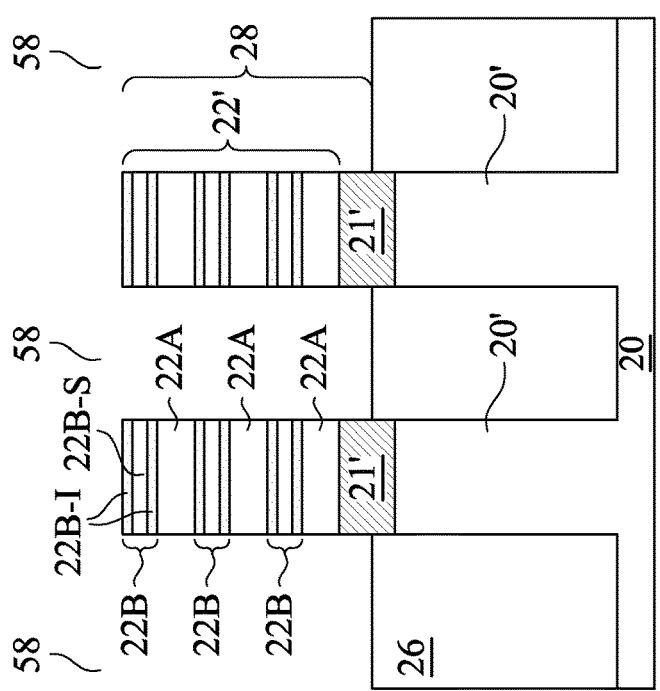

Next, dummy gate electrodes 34 (and hard masks 36, if remaining) are removed in one or more etching processes, so that recesses 58 are formed, as shown in FIGS. 11A and 11B. The respective process is illustrated as process 220 in the process flow 200 shown in FIG. 17. The portions of the dummy gate dielectrics 32 in recesses 58 are also removed. In accordance with some embodiments, dummy gate electrodes 34 and dummy gate dielectrics 32 are removed through an anisotropic dry etching process or an isotropic wet etching process. For example, the etching process may be performed using reaction gas(es) that selectively etch dummy gate electrodes 34 at a faster rate than ILD 52. Each recess 58 exposes and/or overlies portions of multilayer stacks 22', which include the future channel regions in subsequently completed nano-FETs. The portions of the multilayer stacks 22', which include the future channel regions, are between neighboring pairs of the dummy source/drain regions 48.

Figure 12B:
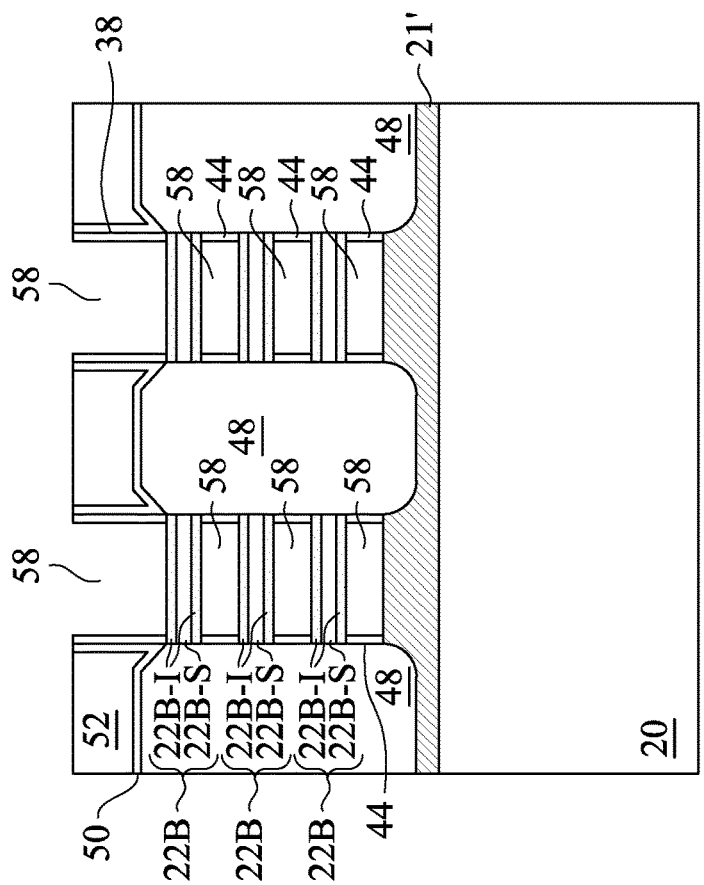
Figure 12A:
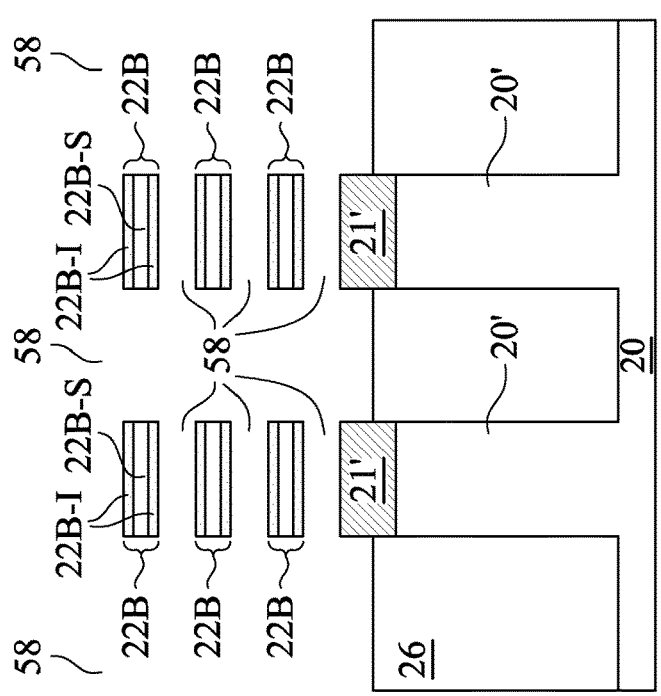

Sacrificial layers 22A are then removed to extend recesses 58 between sandwich structures 22B, and the resulting structure is shown in FIGS. 12A and 12B. The respective process is illustrated as process 222 in the process flow 200 shown in FIG. 17. Sacrificial layers 22A may be removed by performing an isotropic etching process such as a wet etching process using etchants which are selective to the materials of sacrificial layers 22A, while sandwich structures 22B, substrate 20, STI regions 26 remain relatively un-etched as compared to sacrificial layers 22A. In accordance with some embodiments, the etching may be performed through wet etching, with TMAH, diluted HF, buffered HF (BOE, which includes HF and $NH_{4F}$), ammonium hydroxide ($NH_4OH$), or the like may be used to remove sacrificial layers 22A. In accordance with alternative embodiments, a dry etching process may be used, for example, using vapor HF as the etching gas.

Figure 13B:
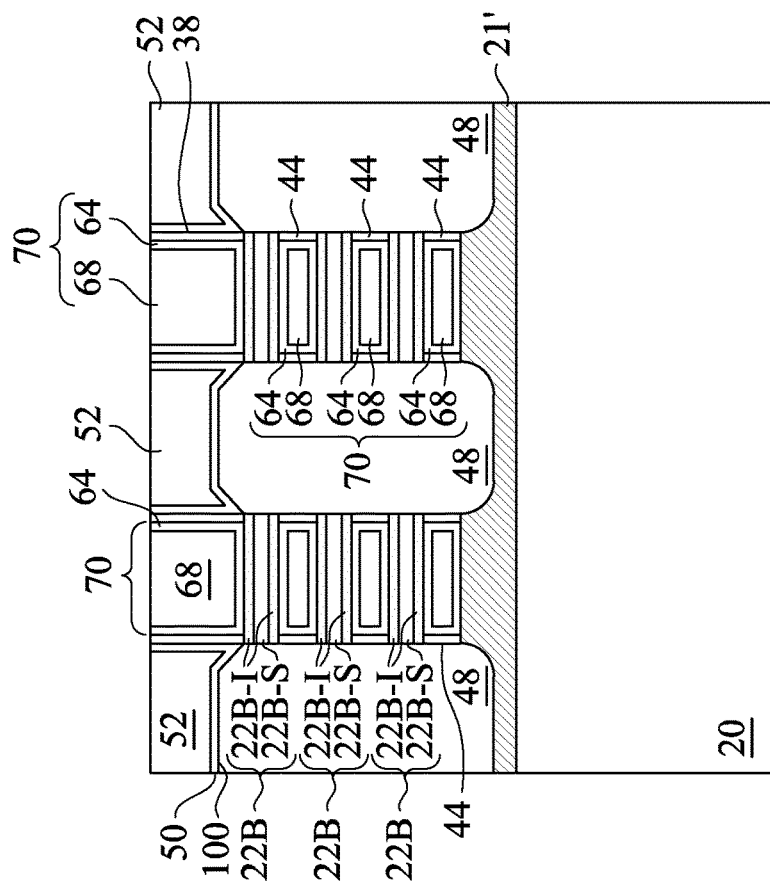
Figure 13A:
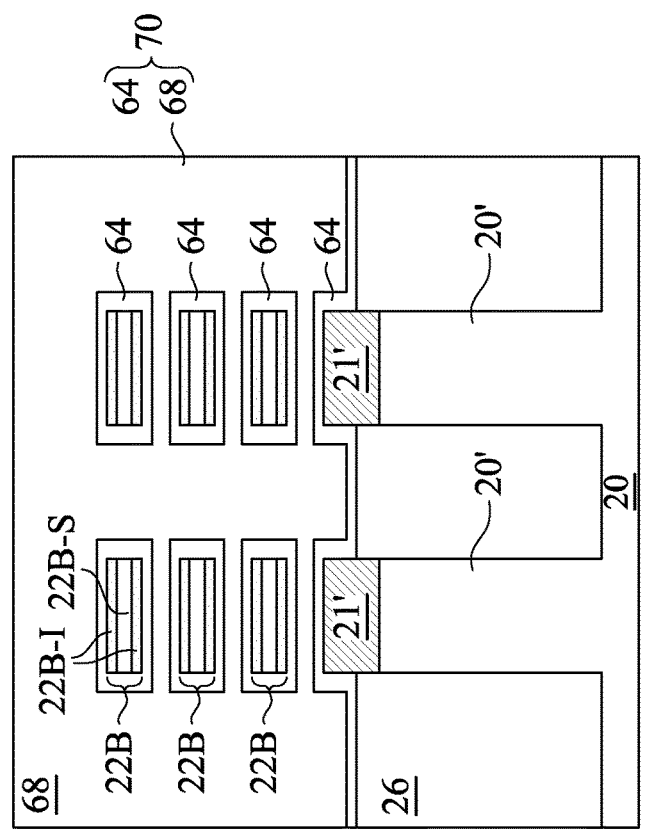

Referring to FIGS. 13A and 13B, gate dielectrics 64 and gate electrodes 68 are formed as parts of replacement gate stacks. The respective process is illustrated as processes 224 and 226 in the process flow 200 shown in FIG. 17. In accordance with some embodiments, gate dielectrics 64 are formed of or comprise a high-k dielectric material. Gate dielectrics 64 may be deposited conformally in recesses 58, with different portions of gate dielectrics 64 having a uniform thickness. Gate dielectrics 64 may be formed on the top surfaces and the sidewalls of the exposed isolation strips 21'. The gate dielectrics 64 may also be deposited on the top surfaces of the ILD 52, CESL 50, gate spacers 38, and STI regions 26. As shown in FIG. 13A, gate dielectrics 64 may be in physical contact with semiconductor material 22B-S, and are spaced apart from the top surface and the bottom surface of semiconductor material 22B-S by isolation layers 22B-I. In accordance with some embodiments, gate dielectrics 64 are formed through a conformal deposition method such as ALD, CVD, or the like, so that the horizontal portions and the vertical portions have the same thickness.

In accordance with some embodiments, gate dielectrics 64 comprise one or more dielectric layers. For example, in accordance with some embodiments, gate dielectrics 64 may be formed of or comprise a high-k dielectric material, which may have a k value greater than about 7.0, and may include a metal oxide or a silicate of hafnium, aluminum, zirconium, lanthanum, manganese, barium, titanium, lead, and combinations thereof.

Gate electrodes 68 are deposited on gate dielectrics 64, and fill the remaining portions of recesses 58, for example, through conformal deposition processes such as CVD or ALD. Gate electrodes 68 may include a metal-containing material such as TiN, TaN, TiAl, TiAlC, cobalt, ruthenium, aluminum, tungsten, combinations thereof, and/or multilayers thereof. For example, although single-layer gate electrodes 68 are illustrated in FIGS. 13A and 13B, gate electrodes 68 may comprise any number of layers, any number of work function layers, and a filling material. Gate electrodes 68 may be deposited to fill the spaces between adjacent ones of sandwich structures 22B, and fill the spaces between the bottom ones of sandwich structures 22B and the underlying substrate strips 20'. In accordance with some embodiments, the formation of gate electrodes 68 may include a plurality of annealing processes, which may be performed at temperatures in the range between about 300° C. and about 500° C.

After the filling of recesses 58, a planarization process such as a CMP process or a mechanical grinding process is performed to remove the excess portions of gate dielectrics 64 and the material of gate electrodes 68, which excess portions are over the top surface of ILD 52. Gate electrodes 68 and gate dielectrics 64 are collectively referred to as gate stacks 70 of the resulting nano-FETs.

Figure 14B:
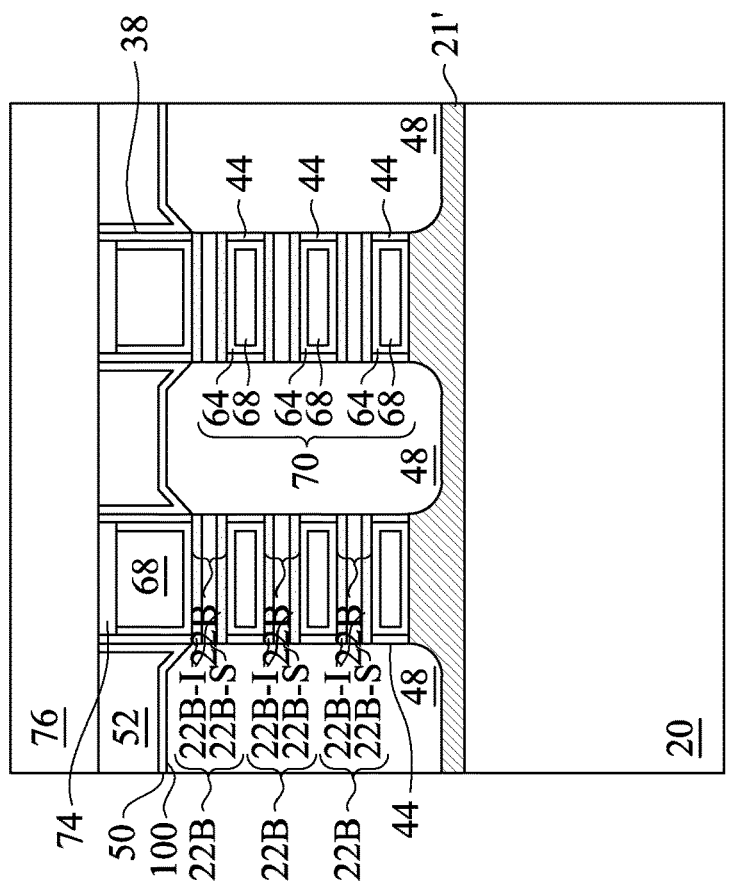
Figure 14A:
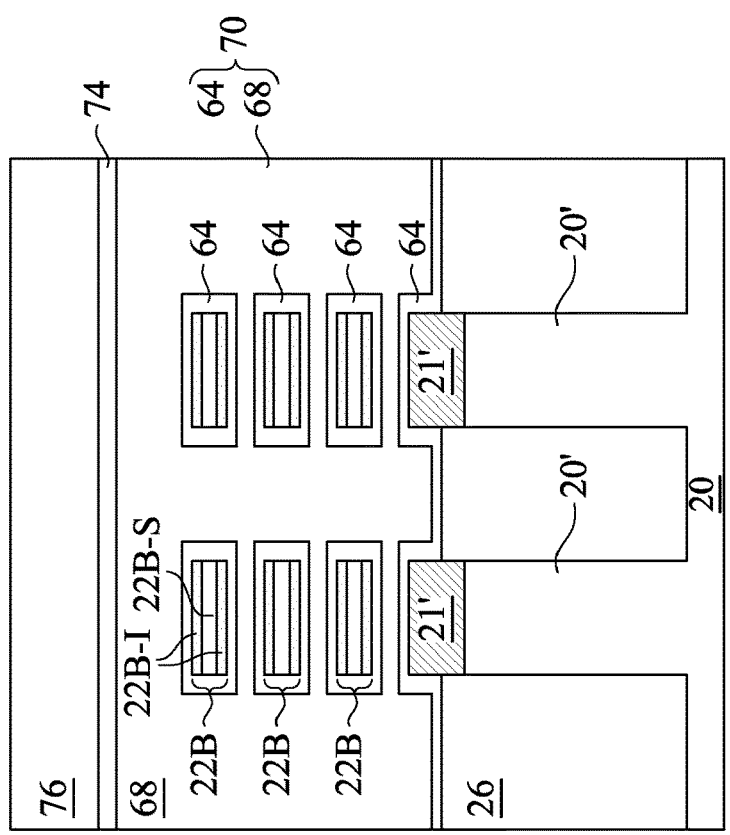
Figure 14C:
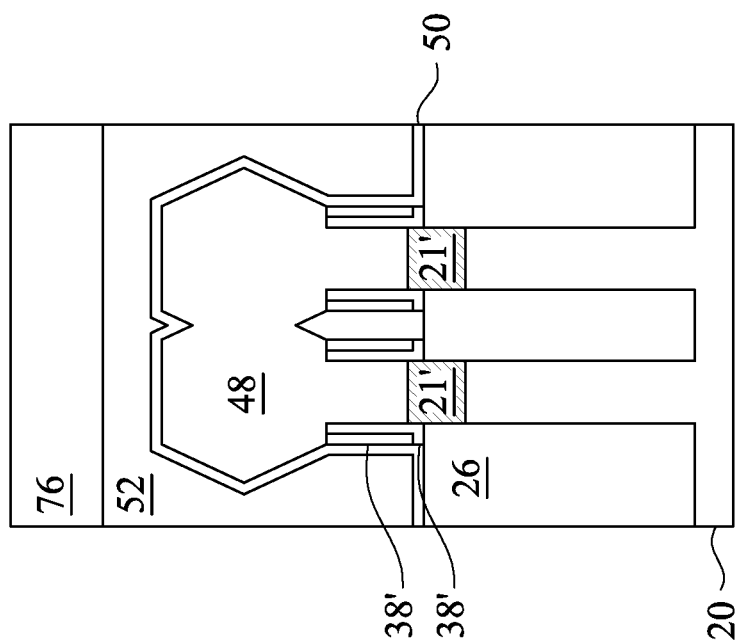

In the processes shown in FIGS. 14A, 14B, and 14C, gate stacks 70 (including gate dielectrics 64 and the corresponding overlying gate electrodes 68) are recessed, so that recesses are formed directly over gate stacks 70 and between opposing portions of gate spacers 38. A gate mask 74 comprising one or more layers of dielectric material, such as silicon nitride, silicon oxynitride, or the like, is filled in each of the recesses, followed by a planarization process to remove excess portions of the dielectric material extending over ILD 52. The respective process is illustrated as process 228 in the process flow 200 shown in FIG. 17. Subsequently formed gate contacts (such as the gate contact plugs 86, discussed below with respect to FIGS. 16A and 16B) will penetrate through the gate mask 74 to contact the top surface of the recessed gate electrodes 68.

As further illustrated by FIGS. 14A, 14B, and 14C, ILD 76 is deposited over ILD 52 and over gate masks 74. The respective process is illustrated as process 230 in the process flow 200 shown in FIG. 17. An etch stop layer (not shown), may be, or may not be deposited before the formation of ILD 76. In accordance with some embodiments, ILD 76 is formed through FCVD, CVD, PECVD, or the like. ILD 76 is formed of a dielectric material, which may be selected from silicon oxide, PSG, BSG, BPSG, USG, or the like.

Figures 15A, 15B:
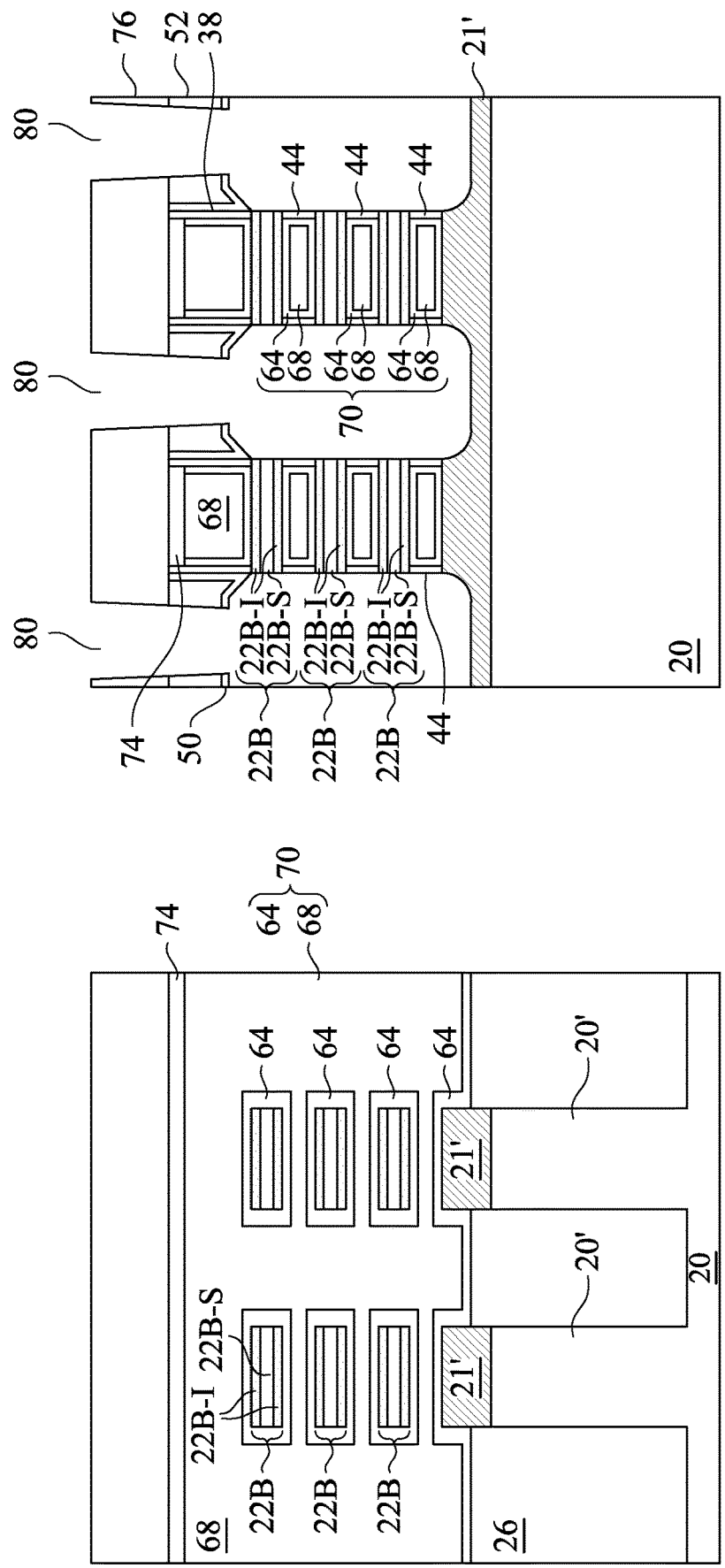
Figure 15C:
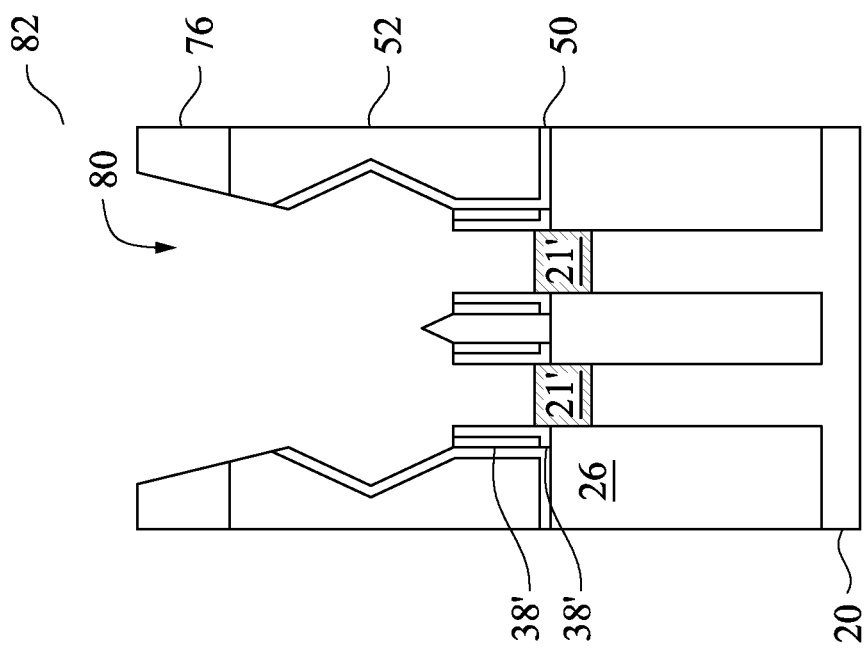

In FIGS. 15A, 15B, and 15C, ILD 76, ILD 52, and CESL 50 are etched to form openings 80 (FIG. 15B), so that dummy source/drain regions 48 (FIG. 14B) are exposed. The respective process is illustrated as process 232 in the process flow 200 shown in FIG. 17. The recesses may be formed through an anisotropic etching process, such as RIE, NBE, or the like.

Next, the exposed dummy source/drain regions 48 are removed, so that openings 80 extend downwardly. The respective process is illustrated as process 234 in the process flow 200 shown in FIG. 17. The sidewalls of sandwich structures 22B and inner spacers 44 are thus exposed to openings 80. In accordance with some embodiments, the removal of dummy source/drain regions 48 is performed through an isotropic dry etching process or an isotropic wet etching process. For example, when the dry etching process is used, the etching gas may include vapor HF. When the wet etching process is used, the etching chemical may include TMAH, diluted HF, BOE, or the like, or combinations thereof. After the etching of dummy source/drain regions 48, the sidewalls of sandwich structures 22B and inner spacers 44 are exposed to openings 80. The top surface of isolation layer 21' is also exposed.

Figure 16B:
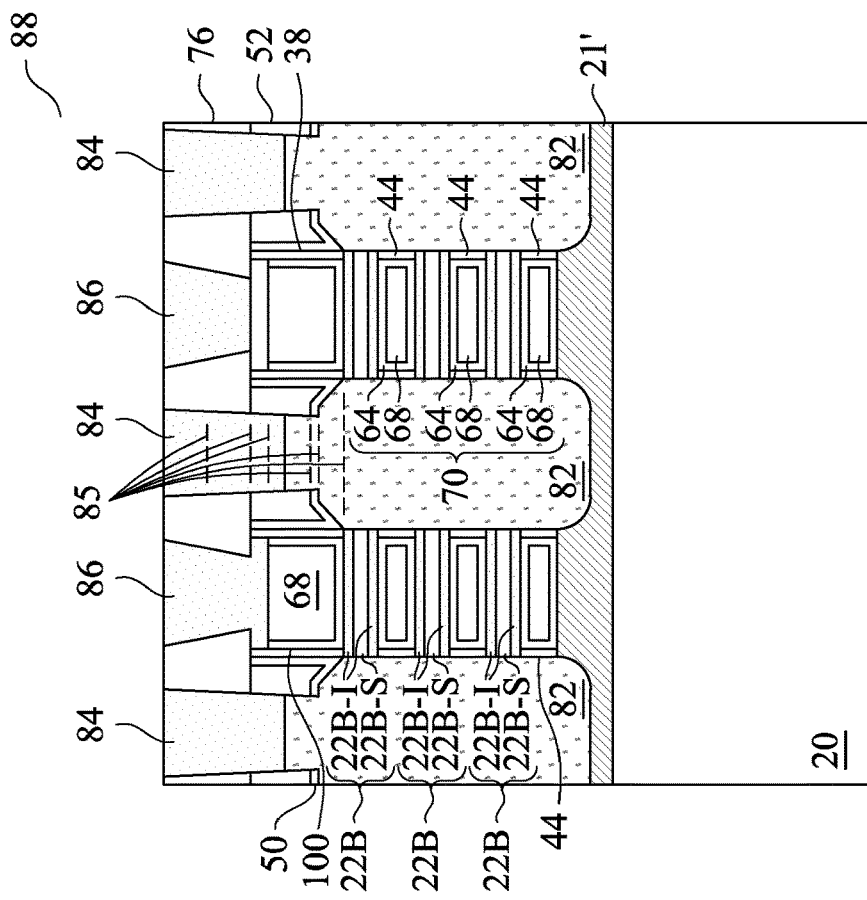
Figure 16A:
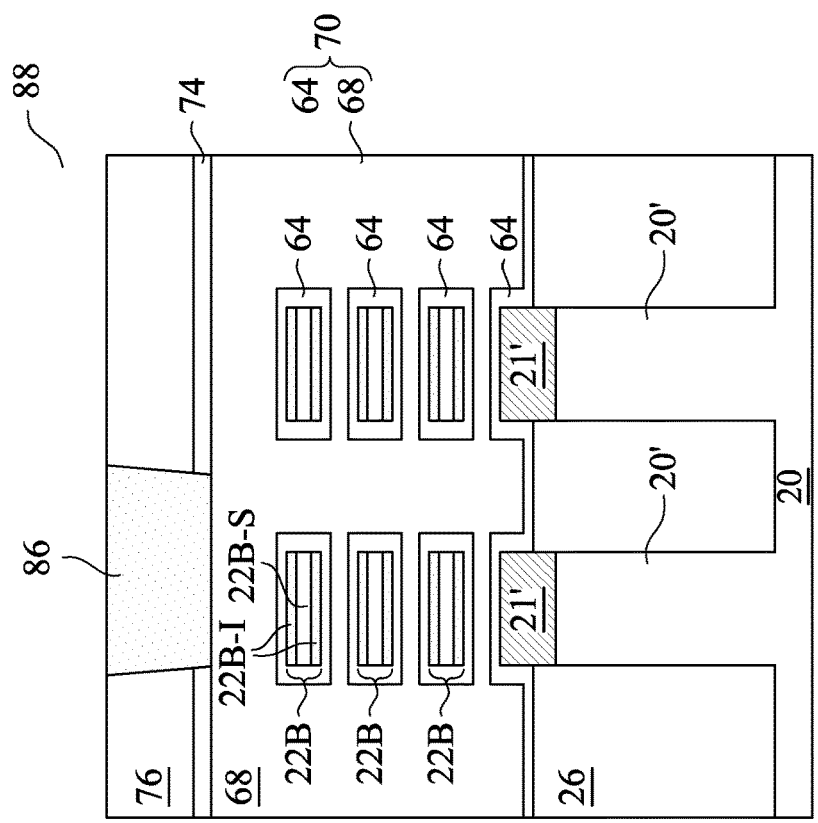
Figure 16C:
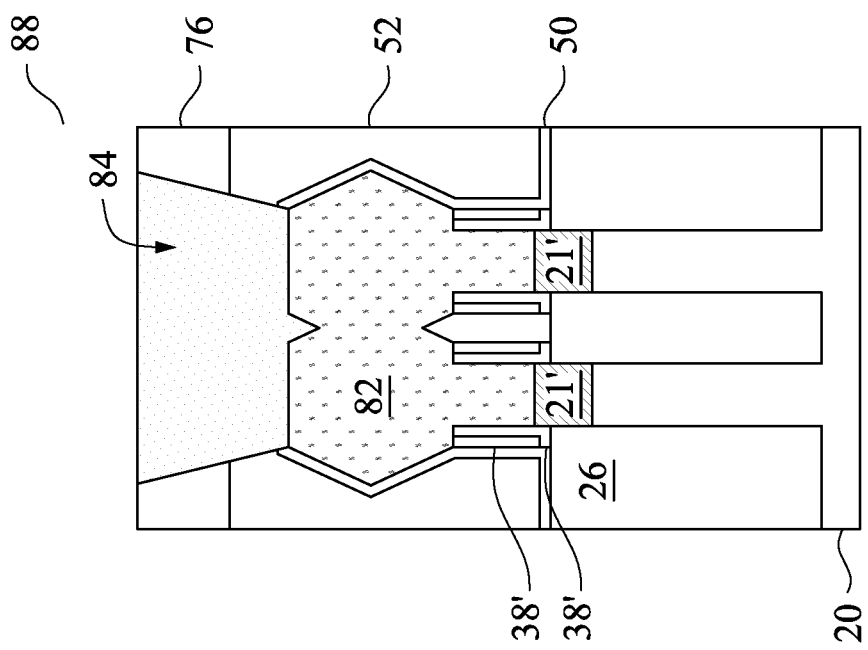
Figure 17:
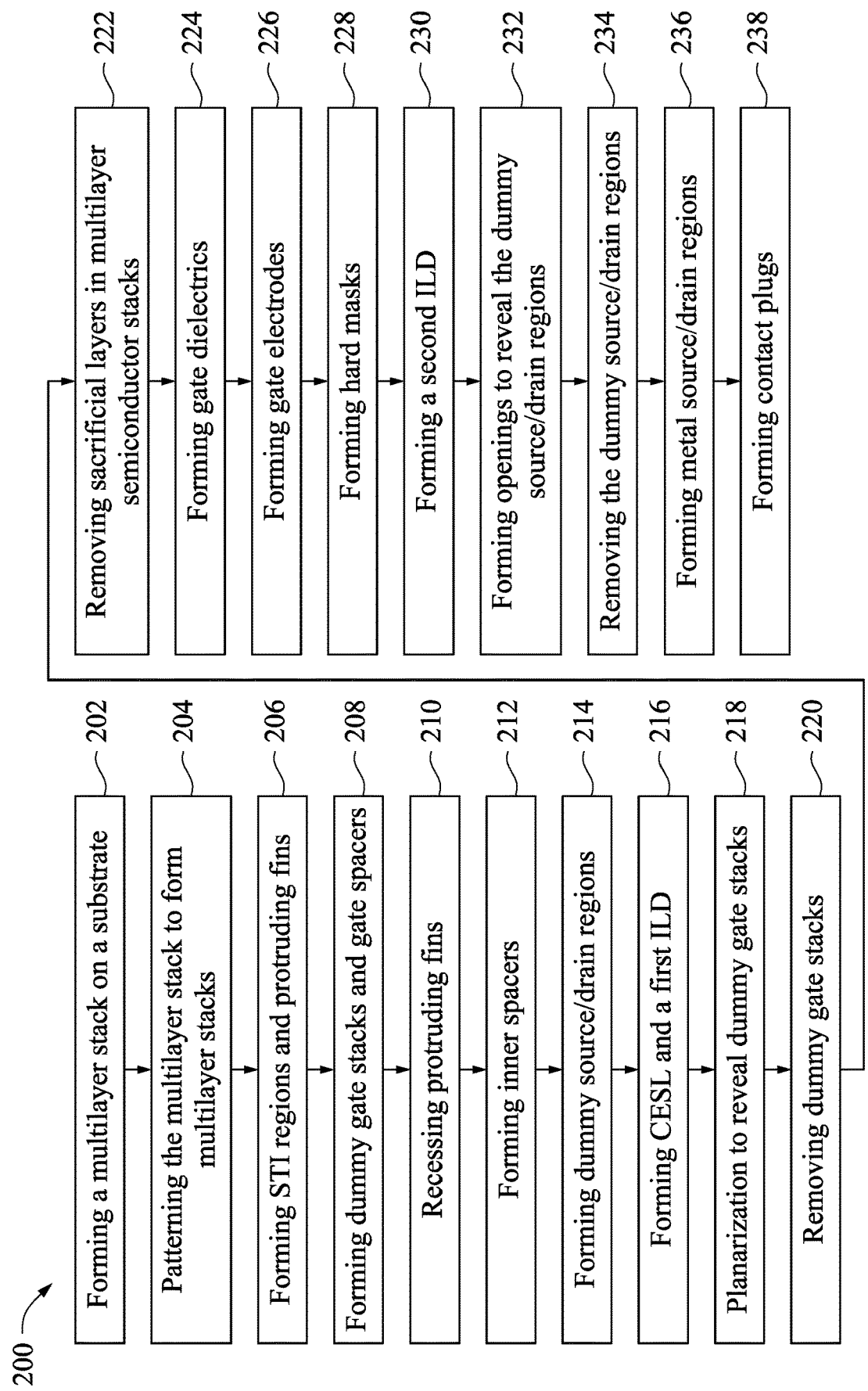
FIG. 17 illustrates a process flow for forming a nanostructure transistor in accordance with some embodiments.

Referring to FIGS. 16A, 16B, and 16C, after the openings 80 are formed and the sidewalls of sandwich structures 22B are exposed, metal source/drain regions 82 are deposited into the bottom portions of openings 80, and are in contact with the sidewalls of sandwich structures 22B. The respective process is illustrated as process 236 in the process flow 200 shown in FIG. 17. Metal source/drain regions 82 thus form Schottky contacts with the sidewalls of semiconductor layers 22B-S. In accordance with some embodiments, the deposition may be performed using a bottom-up deposition method. The top surfaces of metal source/drain regions 82 are higher than the topmost semiconductor layer 22B-S, and may be at any level between the top surface of the topmost semiconductor layer 22B-S and an the top surface of ILD 76. For example, FIG. 16B illustrates dashed lines 85, which are the possible levels of the top surface of metal source/drain regions 82. Accordingly, the top surfaces of metal source/drain regions 82 may be higher than the bottom surface of CESL 50, and metal source/drain regions 82 may penetrate through CESL 50 and extends into ILD 52 or even into ILD 76. In accordance with alternative embodiments, the top surface of metal source/drain regions 82 are coplanar with the top surface of ILD 76, which means the same metal deposition process forms both of metal source/drain regions 82 and source/drain contact plugs 84.

Since metal source/drain regions 82 are formed by replacing dummy source/drain regions at a time after the formation of replacement gate stacks, the metal source/drain regions 82 do not suffer from the thermal budget introduce for forming replacement gate stacks.

In accordance with some embodiments, when the resulting nano-FET is a p-type FET, the fermi level of the corresponding metal in metal source/drain regions 82 are level with the lower half of the band gap of semiconductor layers 22B-S. When the resulting nano-FET is an n-type FET, the fermi level of the corresponding metal in metal source/drain regions 82 are level with the upper half of the band gap of semiconductor layers 22B-S. The p-type nano-FET and the n-type nano-FET may have similar structures (as shown in FIGS. 16A, 16B, and 16C) and are formed on the same substrate 20 and in the same device die.

After the formation of metal source/drain regions 82, source/drain contact plugs 84 are formed. The respective process is illustrated as process 238 in the process flow 200 shown in FIG. 17. In accordance with some embodiments, source/drain contact plugs 84 and metal source/drain regions 82 are formed of different materials (for example, different metals), and hence distinguishable interfaces are formed in between. The interfaces of source/drain contact plugs 84 with the corresponding underlying source/drain regions 82 may be at any level between the top surface of the topmost semiconductor layer 22B-S and the top surface of ILD 76. In accordance with alternative embodiments in which the same formation process and the same material is used for forming both of metal source/drain regions 82 and source/drain contact plugs 84, metal source/drain regions 82 and source/drain contact plugs 84 are formed of the same homogeneous material, and no distinguishable interfaces are formed in between.

Gate contact plugs 86 are also formed to extend into ILD 76 and gate mask 74, and contact the top surfaces of gate electrodes 68. The respective processes are illustrated as process 236 in the process flow 200 shown in FIG. 17. Contact plugs 84 and 86 may each comprise one or more layers, such as a barrier layer, a diffusion layer, and a fill material. For example, in accordance with some embodiments, contact plugs 84 and 86 have a single-layer structure formed of or comprising tungsten, cobalt, or the like. Alternatively, each of contact plugs 84 and 86 includes a barrier layer and a conductive material, and are electrically coupled to the underlying gate electrodes 68 or metal source/drain regions 82. The barrier layer may include titanium, titanium nitride, tantalum, tantalum nitride, or the like. The conductive material may be copper, a copper alloy, silver, gold, tungsten, cobalt, aluminum, nickel, or the like. A planarization process such as a CMP process may be performed to remove excess material from a surface of ILD 76. Nano-FET 88 is thus formed.

The embodiments of the present disclosure have some advantageous features. The 2D materials are good channel materials due to their high carrier mobility and large energy band gap, and the resulting nano-FETs are immune to short-channel effect. The formation of metal contacts to the 2D materials, however, runs into problems. When metal source/drain regions are in contact with the top surfaces of the 2D materials, due to process damage issues, it was found that the fermi level of the metal source/drain regions are pinned to the upper half of the band gap of the 2D material, regardless of the materials of metal source/drain regions and the 2D materials. This effect benefits n-type nano-FET but hurts p-type nano-FETs. In the present disclosure, the metal source/drain regions contact the 2D materials through side contacts. Also, the metal source/drain regions are formed after the formation of replacement gate stacks, and hence the metal source/drain regions do not suffer from the thermal budget of the replacement gate stacks. This solves the fermi level pinning problem, and hence the performance of both of p-type nano-FET and n-type nano-FET may be improved.

In accordance with some embodiments of the present disclosure, a method comprises forming a first sacrificial layer over a substrate; forming a sandwich structure over the first sacrificial layer, wherein the sandwich structure comprises a first isolation layer, a two-dimensional material over the first isolation layer, and a second isolation layer over the two-dimensional material; forming a second sacrificial layer over the sandwich structure; forming a first source/drain region and a second source/drain region on opposing ends of, and contacting sidewalls of, the two-dimensional material; removing the first sacrificial layer and the second sacrificial layer to generate spaces; and forming a gate stack filling the spaces. In an embodiment, the first isolation layer and the second isolation layer are exposed to the spaces, and the gate stack are in contact with the first isolation layer and the second isolation layer. In an embodiment, the first source/drain region and the second source/drain region are dummy regions, and the method further comprises replacing the first source/drain region and the second source/drain region with metal source/drain regions. In an embodiment, the method further comprises forming a dummy gate stack comprising a first portion over the sandwich structure, and second portions on opposing sides of the sandwich structure, wherein the first source/drain region and the second source/drain region are formed on opposite sides of the dummy gate stack; and replacing the dummy gate stack with a replacement gate stack, wherein the metal source/drain regions are formed after the replacement gate stack is formed. In an embodiment, the first source/drain region and the second source/drain region comprise amorphous silicon. In an embodiment, the forming the sandwich structure comprises transferring the first isolation layer and the second isolation layer onto the substrate. In an embodiment, the forming the two-dimensional material comprises forming a TMD material. In an embodiment, the first source/drain region and the second source/drain region are formed directly over and contacting an isolation layer.

In accordance with some embodiments of the present disclosure, a device comprises a channel comprising a two-dimensional material; a first isolation layer underlying the channel; a second isolation layer overlying the channel; a gate stack comprising a first portion underlying the first isolation layer, and a second portion overlying the second isolation layer; and a metal source/drain region contacting a sidewall of the channel. In an embodiment, the device further comprises an inter-layer dielectric, wherein the gate stack has at least a portion in the inter-layer dielectric; and a contact plug over, and forming an interface with, the metal source/drain region, wherein the interface is higher than a bottom surface of the inter-layer dielectric, and the contact plug and the metal source/drain region in combination form a continuous-and-vertical interface with the inter-layer dielectric, and the continuous-and-vertical interface extends from a top surface of the inter-layer dielectric to the bottom surface of the inter-layer dielectric. In an embodiment, the device further comprises a contact etch stop layer underlying the inter-layer dielectric, wherein the contact etch stop layer contacts the contact plug at a point lower than the interface. In an embodiment, the device further comprises an additional isolation layer directly underlying, and contacting a bottom surface of the metal source/drain region. In an embodiment, the first isolation layer and the second isolation layer comprise boron nitride. In an embodiment, the channel comprises a TMD material. In an embodiment, the gate stack is separated from a top surface and a bottom surface of the two-dimensional material by the first isolation layer and the second isolation layer. In an embodiment, the first isolation layer and the second isolation layer are further in contact with the metal source/drain region.

In accordance with some embodiments of the present disclosure, a device comprises a plurality of sandwich structures, wherein upper ones of the plurality of sandwich structures overlap corresponding lower ones of the plurality of sandwich structures, and each of the plurality of sandwich structures comprises a first isolation layer; a two-dimensional material over the first isolation layer; and a second isolation layer over the two-dimensional material; a gate stack encircling each of the plurality of sandwich structures, wherein the gate stack fills spaces between the plurality of sandwich structures; and a metal source/drain region on a side of the plurality of sandwich structures, wherein the metal source/drain region is in contact with sidewalls of the plurality of sandwich structures. In an embodiment, the gate stack is in contact with sidewalls of the two-dimensional material in the plurality of sandwich structures. In an embodiment, the device further comprises a contact plug over and contacting the metal source/drain region, wherein the metal source/drain region comprises a lower portion, and an upper portion narrower than the lower portion, and edges of the upper portion as vertically aligned to corresponding edges of the contact plug. In an embodiment, the two-dimensional material comprises a TMD material, and the first isolation layer and the second isolation layer in one of the plurality of sandwich structures comprise hBN.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a first sacrificial layer over a substrate;
forming a sandwich structure over the first sacrificial layer, wherein the sandwich structure comprises a first isolation layer, a two-dimensional material over the first isolation layer, and a second isolation layer over the two-dimensional material;
forming a second sacrificial layer over the sandwich structure;
forming a first source/drain region and a second source/drain region on opposing ends of, and contacting sidewalls of, the two-dimensional material;
removing the first sacrificial layer and the second sacrificial layer to generate spaces; and
forming a gate stack filling the spaces.

2. The method of claim 1, wherein the first isolation layer and the second isolation layer are exposed to the spaces, and the gate stack are in contact with the first isolation layer and the second isolation layer.

3. The method of claim 1, wherein the first source/drain region and the second source/drain region are dummy regions, and the method further comprises:
replacing the first source/drain region and the second source/drain region with metal source/drain regions.

4. The method of claim 3 further comprising:
forming a dummy gate stack comprising a first portion over the sandwich structure, and second portions on opposing sides of the sandwich structure, wherein the first source/drain region and the second source/drain region are formed on opposite sides of the dummy gate stack; and
replacing the dummy gate stack with a replacement gate stack, wherein the metal source/drain regions are formed after the replacement gate stack is formed.

5. The method of claim 3, wherein the first source/drain region and the second source/drain region comprise amorphous silicon.

6. The method of claim 1, wherein the forming the sandwich structure comprises transferring the first isolation layer and the second isolation layer onto the substrate.

7. The method of claim 1, wherein the forming the two-dimensional material comprises forming a Transition Metal Dichalcogenide (TMD) material.

8. The method of claim 1, wherein the first source/drain region and the second source/drain region are formed directly over and contacting a third isolation layer.

9. A method comprising:
forming a first isolation layer;
forming a channel comprising a two-dimensional material over the first isolation layer;
forming a second isolation layer overlying the channel;
forming a gate stack comprising a first portion underlying the first isolation layer, and a second portion overlying the second isolation layer;
forming a source/drain region contacting a sidewall of the channel; and
forming an inner spacer underlying and contacting a bottom surface of the first isolation layer to form a horizontal interface, wherein the inner spacer spaces the source/drain region from the gate stack.

10. The method of claim 9 further comprising:
forming an inter-layer dielectric, wherein the gate stack has at least a portion in the inter-layer dielectric; and
forming a contact plug over and forming an interface with the source/drain region, wherein the interface is higher than a bottom surface of the inter-layer dielectric, and the contact plug and the source/drain region collectively form a continuous-and-vertical interface with the inter-layer dielectric, and the continuous-and-vertical interface extends from a top surface of the inter-layer dielectric to the bottom surface of the inter-layer dielectric.

11. The method of claim 10 further comprising, before the inter-layer dielectric is formed, forming a contact etch stop layer, wherein the contact etch stop layer contacts the contact plug at a point lower than the interface.

12. The method of claim 9 further comprising forming an additional isolation layer, wherein a bottom surface of the source/drain region contacts the additional isolation layer.

13. The method of claim 9, wherein the forming the first isolation layer, the channel, and the second isolation layer comprises:
depositing a first blanket dielectric layer;
depositing a semiconductor layer over the first blanket dielectric layer;
depositing a second blanket dielectric layer over the semiconductor layer; and
patterning the first blanket dielectric layer, the semiconductor layer, and the second blanket dielectric layer to form the first isolation layer, the channel, and the second isolation layer, respectively.

14. The method of claim 9, wherein the forming the channel comprises depositing a Transition Metal Dichalcogenide (TMD) layer.

15. The method of claim 9, wherein the first isolation layer has a uniform thickness, and first opposing edges of the first isolation layer are vertically aligned to second opposing edges of the channel.

16. The method of claim 9, wherein sidewalls of the first isolation layer and the second isolation layer are further in contact with the source/drain region.

17. A method comprising:
forming a multi-layer stack comprising:
forming a plurality of sandwich structures, wherein upper ones of the plurality of sandwich structures overlap corresponding lower ones of the plurality of sandwich structures, and each of the plurality of sandwich structures comprises:
a first isolation layer;

a two-dimensional material over the first isolation layer; and a second isolation layer over the two-dimensional material; and forming a plurality of sacrificial layers, wherein the plurality of sandwich structures and the plurality of sacrificial layers are located alternatingly;

removing the plurality of sacrificial layers to form recesses, wherein bottom surfaces of the first isolation layers and top surfaces of the second isolation layers in the plurality of sandwich structures are revealed to the recesses;

forming a gate stack extending into the recesses, wherein the gate stack encircles each of the plurality of sandwich structures; and forming a metal source/drain region on a side of the plurality of sandwich structures, wherein the metal source/drain region is in contact with sidewalls of the plurality of sandwich structures.

18. The method of claim 17, wherein the gate stack is in contact with sidewalls of the two-dimensional materials in the plurality of sandwich structures, and is spaced apart from top surfaces and bottom surfaces of the two-dimensional materials in the plurality of sandwich structures.

19. The method of claim 17 further comprising forming a contact plug over and contacting the metal source/drain region, wherein the metal source/drain region comprises a lower portion, and an upper portion narrower than the lower portion, and edges of the upper portion are vertically aligned to corresponding edges of the contact plug.

20. The method of claim 17 further comprising:

forming a dummy source/drain region on the side of the plurality of sandwich structures; and removing the dummy source/drain region, wherein the metal source/drain region is formed in a space left by the dummy source/drain region that has been removed.

* * * * *